(12) United States Patent
Sung et al.

(10) Patent No.: US 11,985,835 B2
(45) Date of Patent: May 14, 2024

(54) FILM STRUCTURE, ELEMENT, AND MULTILEVEL ELEMENT

(71) Applicant: IUCF-HYU (INDUSTRY-UNIVERSITY COOPERATION FOUNDATION HANYANG UNIVERSITY), Seoul (KR)

(72) Inventors: Myungmo Sung, Seoul (KR); Hongbum Kim, Seoul (KR); Jinwon Jung, Suwon-si (KR); Jinseon Park, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 198 days.

(21) Appl. No.: 17/285,633

(22) PCT Filed: Mar. 20, 2019

(86) PCT No.: PCT/KR2019/003242
§ 371 (c)(1),
(2) Date: Apr. 15, 2021

(87) PCT Pub. No.: WO2020/080621
PCT Pub. Date: Apr. 23, 2020

(65) Prior Publication Data
US 2021/0384452 A1     Dec. 9, 2021

(30) Foreign Application Priority Data

Oct. 18, 2018 (KR) .................. 10-2018-0124405
Feb. 22, 2019 (KR) .................. 10-2019-0021029

(51) Int. Cl.
*H10K 10/46* (2023.01)

(52) U.S. Cl.
CPC ......... *H10K 10/486* (2023.02); *H10K 10/466* (2023.02)

(58) Field of Classification Search
CPC . H01L 29/0665; H01L 29/122; H01L 29/125; H01L 29/127; H01L 29/66977;
(Continued)

(56) References Cited

U.S. PATENT DOCUMENTS

| 5,221,849 A | 6/1993 | Goronkin et al. |
| 2010/0289004 A1 | 11/2010 | Nakahara et al. |

(Continued)

FOREIGN PATENT DOCUMENTS

| EP | 0 436 089 A2 | 7/1991 |
| JP | 6-163901 A | 6/1994 |

(Continued)

OTHER PUBLICATIONS

International search report for PCT/KR2019/003242 dated Jul. 18, 2019.

*Primary Examiner* — Raj R Gupta
(74) *Attorney, Agent, or Firm* — Sughrue Mion, PLLC

(57) ABSTRACT

The film structure according to an embodiment of the present invention includes at least one active monolayer having an energy level quantized in at least one axial direction and at least one barrier alternately stacked with the at least one active monolayer. Current flows through the active monolayer, and the current flow may be limited by the quantized energy level.

15 Claims, 25 Drawing Sheets

(58) Field of Classification Search
CPC .............. H01L 29/7782; H01L 49/006; H01L 51/0562
See application file for complete search history.

(56) References Cited

U.S. PATENT DOCUMENTS

| | | |
|---|---|---|
| 2011/0133168 A1 | 6/2011 | Dewey et al. |
| 2014/0339544 A1 | 11/2014 | Hanaoka et al. |
| 2017/0069689 A1* | 3/2017 | Afzali-Ardakani .... H05B 45/60 |
| 2017/0256572 A1* | 9/2017 | Yamazaki ............. G11C 11/401 |
| 2018/0187306 A1* | 7/2018 | Ahlf ...................... C23C 16/403 |

FOREIGN PATENT DOCUMENTS

| | | |
|---|---|---|
| JP | 8-8355 B2 | 1/1996 |
| JP | 2015-216282 A | 12/2015 |
| JP | 2017-17279 A | 1/2017 |
| JP | 2017-163137 A | 9/2017 |
| JP | 2017-527118 A | 9/2017 |
| KR | 10-1995-0010120 A | 4/1995 |
| KR | 10-1780219 B1 | 9/2017 |
| KR | 10-2018-0037177 A | 4/2018 |
| WO | 2016/032680 A1 | 3/2016 |
| WO | 2016/203184 A1 | 12/2016 |

* cited by examiner

| DEZ | P | DEZ | P | DEZ | P | DEZ | P |
|---|---|---|---|---|---|---|---|
| 3s | 15s | 3s | 15s | 3s | 15s | 3s | 15s |
| 1 Torr | | 1 Torr | | 1 Torr | | 1 Torr | |

| $H_2O$ | P | $H_2O$ | P | $H_2O$ | P | $H_2O$ | P |
|---|---|---|---|---|---|---|---|
| 3s | 25s | 3s | 25s | 3s | 25s | 3s | 25s |
| 1 Torr | | 1 Torr | | 1 Torr | | 1 Torr | |

| WF$_6$ | P | WF$_6$ | P | WF$_6$ | P | WF$_6$ | P | WF$_6$ | P |
|---|---|---|---|---|---|---|---|---|---|
| 30s | 30s | 30s | 30s | 30s | 30s | 30s | 30s | 30s | 30s |
| 1.0 Torr | | 1.0 Torr | | 1.0 Torr | | 1.0 Torr | | 1.0 Torr | |

| Si$_2$H$_6$ | P | Si$_2$H$_6$ | P | Si$_2$H$_6$ | P | Si$_2$H$_6$ | P | Si$_2$H$_6$ | P |
|---|---|---|---|---|---|---|---|---|---|
| 30s | 30s | 30s | 30s | 30s | 30s | 30s | 30s | 30s | 30s |
| 1.0 Torr | | 1.0 Torr | | 1.0 Torr | | 1.0 Torr | | 1.0 Torr | |

| Sulphur powder | P | | | | | | | | | |
|---|---|---|---|---|---|---|---|---|---|---|
| 30s | 30s | | | | | | | | | |

| WF₆ | P | WF₆ | P | WF₆ | P | WF₆ | P | WF₆ | P |
|---|---|---|---|---|---|---|---|---|---|
| 30s | 30s | 30s | 30s | 30s | 30s | 30s | 30s | 30s | 30s |
| 1 Torr | | 1 Torr | | 1 Torr | | 1 Torr | | 1 Torr | |

| Si₂H₆ | P | Si₂H₆ | P | Si₂H₆ | P | Si₂H₆ | P | Si₂H₆ | P |
|---|---|---|---|---|---|---|---|---|---|
| 30s | 30s | 30s | 30s | 30s | 30s | 30s | 30s | 30s | 30s |
| 1 Torr | | 1 Torr | | 1 Torr | | 1 Torr | | 1 Torr | |

| Sulphur powder | P |
|---|---|
| 30s | 30s |

(a)  (b)

(a)

(b)

FILM STRUCTURE, ELEMENT, AND MULTILEVEL ELEMENT

TECHNICAL FIELD

The present invention relates to a film structure and an element, and more particularly, to a film structure, an element and a multilevel element including a quantized active monolayer.

BACKGROUND ART

Recently, higher performance is required in terms of hardware or software. Accordingly, research on electronic devices that are faster, have a larger capacity, and consume less power is being actively conducted.

However, even if the existing MOSFET is miniaturized, there is a limit to miniaturization. This is because a problem occurs due to the miniaturization itself. For example, as the density of a device on an integrated circuit increases, a high temperature occurs, which causes a problem of deteriorating the reliability of the device.

Therefore, the approach through down scaling has a fundamental limitation in achieving the characteristics of electronic devices required in the future.

Accordingly, the present inventors seek to solve the problems of the prior art through creative film structures, devices, and multilevel devices that can be applied to future-oriented devices.

DISCLOSURE

Technical Problem

One technical problem to be solved by the present invention is to provide a film structure and a device in which the flow of current is limited.

Another technical problem to be solved by the present invention is to provide a film structure and a device including a quantized active monolayer.

Another technical problem to be solved by the present invention is to provide a film structure and a device including an active monolayer quantized in one axis or three axes.

Another technical problem to be solved by the present invention is to provide a film structure and a device having a superlattice structure.

Another technical problem to be solved by the present invention is to provide a film structure and a device having a quantum well structure.

Another technical problem to be solved by the present invention is to provide a film structure and a device in which a current/gate voltage is less than or equal to a predetermined slope above a threshold voltage.

Another technical problem to be solved by the present invention is to provide a film structure and a device that are easy to manufacture.

Another technical problem to be solved by the present invention is to provide a multilevel device.

Another technical problem to be solved by the present invention is to provide a multilevel device having a simple manufacturing process.

One technical problem to be solved by the present invention is to provide an ultra-thin multilevel device.

The technical problem to be solved by the present invention is not limited to the above.

Technical Solution

The film structure according to an embodiment of the present invention includes at least one active monolayer having an energy level quantized in at least one axial direction and at least one barrier alternately stacked with the at least one active monolayer. Current flows through the active monolayer, and the current flow may be limited by the quantized energy level.

According to an embodiment, the active monolayer and the barrier may have a hybrid superlattice structure.

According to an embodiment, the active monolayer may have a two-dimensional layered structure.

According to an embodiment, the stacking of the monolayer and the barrier may provide a quantum well structure.

According to an embodiment, when the active monolayer is made of an elementary metal or a transition metal dichalcogenide (TMDC), the active monolayer may have an energy level quantized in a short axis direction.

According to an embodiment, when the active monolayer is made of a metal oxide, the active monolayer may have an energy level quantized in a 3-axis direction.

According to an embodiment, even if the intensity of a field applied to the active monolayer increases, the flow of current may be limited by the quantized energy level.

A film structure according to an embodiment of the present invention includes at least one active monolayer having a two-dimensional layered structure; and at least one barrier alternately stacked with the at least one active monolayer, wherein the active monolayer and the barrier may have a hybrid superlattice structure.

A film structure according to an embodiment of the present invention includes at least one active monolayer of a quantum well structure, wherein the active monolayer has an energy level quantized in at least one axial direction, and a flow of current flowing through the active monolayer may be limited by the quantized energy level.

A device according to an embodiment of the present invention includes a gate electrode; a gate insulating layer on one side of the gate electrode; at least one active monolayer provided on one side of the gate insulating layer; at least one barrier alternately stacked with the at least one active monolayer; and a source electrode and a drain electrode, wherein current flows between the source electrode and the drain electrode through the active monolayer when a gate voltage is applied to the gate electrode.

According to an embodiment, the active monolayer may have a quantized energy level in at least one axis direction.

According to an embodiment, the quantized energy level may limit an amount of current flowing through the active monolayer when the gate voltage is equal to or higher than a turn on voltage.

According to an embodiment, by limiting the amount of current flowing through the active monolayer, a change in current between the source and drain electrodes with respect to the voltage applied to the gate electrode may be less than or equal to a predetermined slope.

According to an embodiment, when the active monolayer includes at least one of an elementary metal and a TMDC, the active monolayer may have an energy level quantized in a short axis direction.

When the active monolayer includes a metal oxide, the active monolayer may have an energy level quantized in a 3-axis direction.

According to an embodiment, the active monolayer may include a plurality of crystalline regions and an amorphous region surrounding the crystalline region.

According to an embodiment, the active monolayer may have an energy level quantized in a 3-axis direction.

According to an embodiment, the barrier may be stacked between the active monolayer and the source and drain electrodes.

According to an embodiment, the active monolayer may have a structure sandwiched between the barriers.

According to an embodiment, the active monolayer may have a predetermined thickness, and the predetermined thickness may be a nanometer size.

The device according to an embodiment of the present invention includes a gate electrode, a gate insulating layer on one side of the gate electrode, and at least one active monolayer provided on one side of the gate insulating layer. Even if a gate voltage applied to the gate electrode is increased, an increase in the current flowing through the active monolayer may be limited.

The multilevel device according to an embodiment of the present invention includes a gate electrode, a first active layer formed on one side of the gate electrode and including a first transition metal dichalcogenide (TMDC), a second active layer formed on one side of the first active layer and including a second TMDC, source and drain electrodes provided on one side of the second active layer, and a barrier layer separating the first active layer and the second active layer.

A multilevel device according to an embodiment of the present invention may include a gate electrode, a first active layer formed on one side of the gate electrode and including a first elementary metal, a second active layer formed on one side of the first active layer and including a second elementary metal, source and drain electrodes provided on one side of the second active layer, and a barrier layer separating the first active layer and the second active layer.

According to an embodiment, the number of activated active layers among the first and second active layers may be controlled according to a gate voltage applied to the gate electrode.

According to an embodiment, the first active layer, the barrier layer, the second active layer, and the source and drain electrodes may be sequentially stacked and formed.

According to an embodiment, the source electrode and the drain electrode may electrically contact only the second active layer.

According to an embodiment, the source electrode and the drain electrode may be electrically non-contact with the first active layer.

According to an embodiment, the voltage applied to the gate electrode divided into a first gate voltage range, a second gate voltage range, and a third gate voltage range, and the first, the second, and the third gate voltage ranges may be provided in an increasing order of the gate voltage.

According to an embodiment, when the gate voltage within the first gate voltage range is applied to the gate electrode, only the first active layer may be activated. When the gate voltage within the third gate voltage range is applied to the gate electrode, the first and second active layers may be activated.

According to an embodiment, the first active layer may be in a saturation state within the second gate voltage range.

According to an embodiment, when the gate voltage of the first gate voltage range or the second gate voltage range is applied to the gate electrode, a field from the gate electrode applied to the second active layer can be shielded by a current flowing through the first active layer.

According to an embodiment, the first and second active layers may include TMDC monolayers.

A method of manufacturing a multilevel device according to an embodiment of the present invention may include depositing a first active layer including a first TMDC, depositing a barrier layer on one side of the first active layer, and depositing a second active layer including a second TMDC on one side of the barrier layer.

According to an embodiment, at least one of the steps of depositing the first active layer and the second active layer may include depositing the TMDC monolayer. The step of depositing the TMDC monolayer may include a first chalcogen deposition step of dosing and purging a chalcogen source gas, a metal precursor source gas pressurized dosing step for adsorbing a transition metal precursor to a substrate by providing a metal precursor source gas containing the transition metal precursor in a state where an outlet of a chamber is closed to increase a pressure in the chamber, a first main purging step of purging the chamber after the metal precursor source gas pressurized dosing step, a reactive gas dosing step of providing a reactive gas after the first main purging step, a second main purging step of purging the chamber after the reactive gas dosing step, and a second chalcogen deposition step of dosing and purging the chalcogen source gas.

A method of manufacturing a multilevel device according to an exemplary embodiment of the present invention may include depositing a first active layer including a first elementary metal, depositing a barrier layer on one side of the first active layer, and depositing a second active layer including a second elementary metal on the one side of the barrier layer.

According to an embodiment, the at least one active layer deposition step of depositing the first and second active layers may include a source gas pressurized dosing step for adsorbing a metal precursor to a substrate by providing a metal precursor source gas containing the metal precursor in a state where an outlet of a chamber is closed to increase a pressure in the chamber, a first main purging step of purging the chamber after the source gas pressurized dosing step, a reactive gas dosing step of providing a reactive gas after the first main purging step, and a second main purging step of purging the chamber after the reactive gas dosing step.

Advantageous Effects

The film structure according to an embodiment of the present invention includes at least one active monolayer having an energy level quantized in at least one axial direction and at least one barrier alternately stacked with the at least one active monolayer.

According to an embodiment, the stacking of the monolayer and the barrier may provide a quantum well structure, and since the active monolayer has an energy level quantized in at least one axial direction, the flow of current may be limited even when the gate voltage swing.

In addition, since the active monolayer has a two-dimensional layered structure and has a hybrid superlattice structure, stability may be improved.

In addition, since the manufacturing process of the film structure according to an embodiment of the present invention can be performed at a low temperature process, excellent process stability can be provided.

In addition, a hybrid superlattice structure may be easily provided by the manufacturing process of the film structure according to an embodiment of the present invention.

The multilevel device according to an embodiment of the present invention may provide multilevel conductivity.

The multilevel device according to an embodiment of the present invention can provide a simple manufacturing method.

The multilevel device according to an embodiment of the present invention can provide easy thickness control of the active layer.

The multilevel device according to an embodiment of the present invention may provide ultra-thin film properties.

The effects of the present invention are not limited to the above-described effects, and may be more apparent by the following description.

MODES OF THE INVENTION

Figure 1:
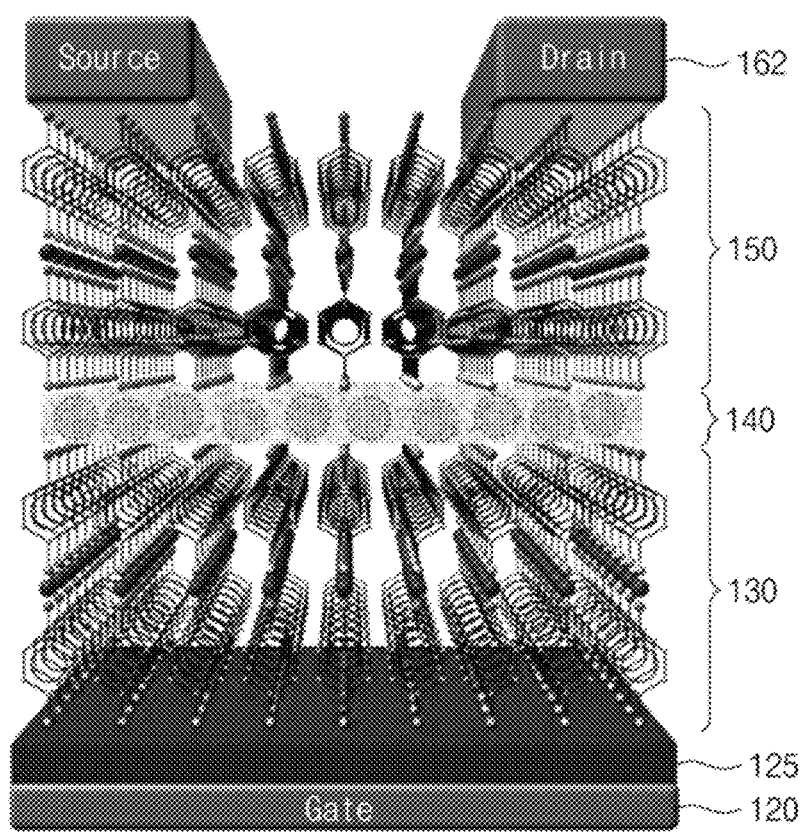
FIGS. 1 to 3 are diagrams for illustrating a device according to a first embodiment of the present invention.

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, when any element is referred to as being "on" other element, it means that the element may be formed directly on the other element, or that a third element may be interposed therebetween. In the drawings, the thicknesses of layers and regions may have been exaggerated in order to clearly illustrate features of the embodiments.

In addition, although the terms 'first', 'second', "third" etc. may be used to describe various elements in various embodiments of the present invention, these elements should not be limited by these terms. These terms are only used to distinguish any element from other element. Thus, a first element mentioned in any one embodiment may be termed a second element in other embodiment. Each embodiment described and exemplified herein also includes a complementary embodiment thereof. As used herein, the term "and/or" is meant to include at least one of components listed before and after the term "and/or".

In the specification, singular expressions include plural expressions unless specified otherwise in the context thereof. In addition, the terms "comprise", "have", etc., are intended to denote the existence of mentioned characteristics, numbers, steps, elements, components, or combinations thereof, but do not exclude the probability of existence or addition of one or more other characteristics, numbers, steps, elements, components, or combinations thereof. As used herein, the term "connecting" includes connecting a plurality of elements both directly and indirectly.

Furthermore, in the following description, detailed description of related known functions and configurations will be omitted when it may unnecessarily obscure the subject matter of the present invention.

A film according to an embodiment of the present invention includes at least one active monolayer having an energy level quantized in at least one axial direction and at least one barrier alternately stacked with the at least one active monolayer, wherein a current may flow through the active monolayer, and the flow of current may be limited by the quantized energy level.

In this case, since the active monolayer has the quantized energy level in at least one axis direction, the amount of current flowing through the active monolayer may be limited.

If the active monolayer includes at least one of a metal monoatomic layer and a TMDC layer, the active monolayer may have an energy level quantized in a short axis direction. In contrast, when the active monolayer includes a metal oxide, the active monolayer may have an energy level quantized in a 3-axis direction. In this case, despite the field swing, the intensity of the current flowing through the active monolayer may be constant. That is, a current saturation state can be provided.

The current saturation characteristic may be understood as a unique effect according to an embodiment of the present invention. Hereinafter, for a detailed description, a first embodiment in which a metal oxide layer is used as an active monolayer will be described with reference to FIGS. 1 to 12.

Figure 2:
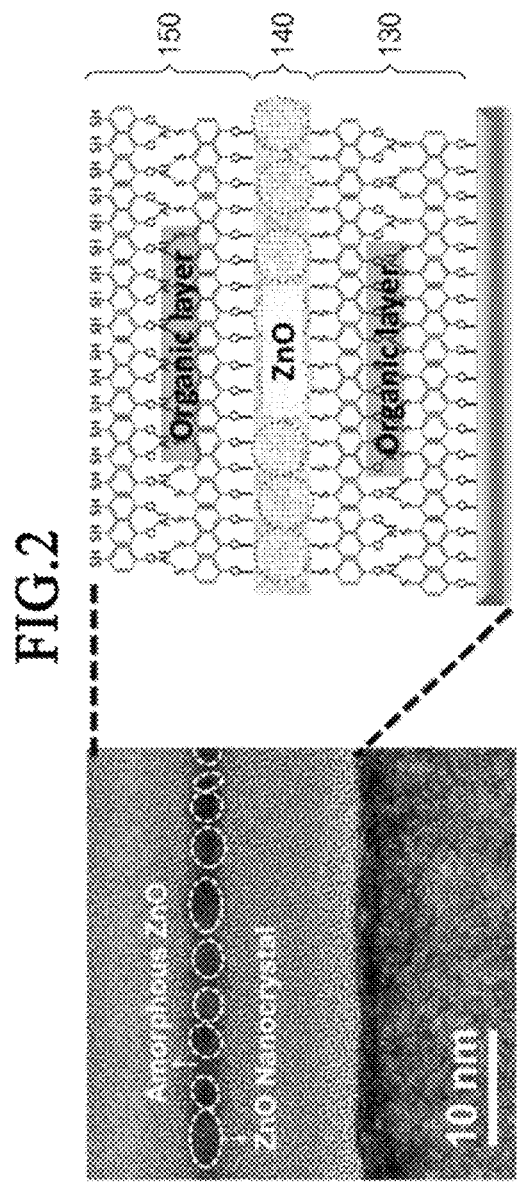
Figure 3:
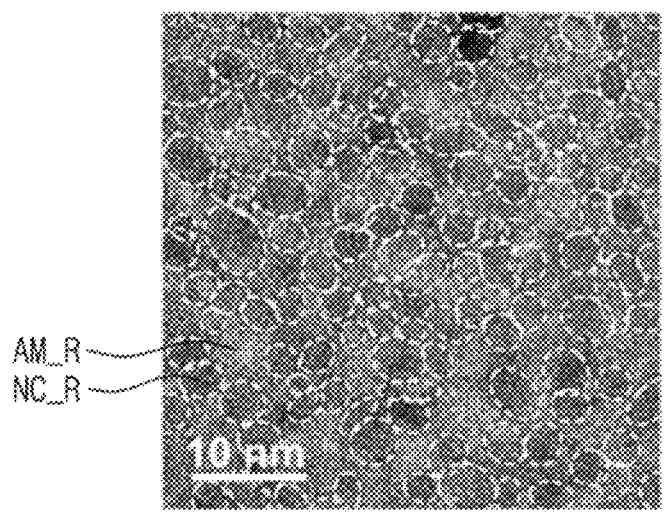

FIGS. 1 to 3 are views for illustrating a device according to a first embodiment of the present invention.

According to FIGS. 1 to 3, the device 100a according to the first embodiment of the present invention includes at least one of a substrate (not shown), a gate electrode 120, a first barrier 130, an active monolayer 140, a second barrier 150, a source electrode 160, and a drain electrode 162. It may be referred to as a film structure including at least one of the active monolayer and the barrier. Hereinafter, each component will be described.

The substrate is not limited to any particular type, and may be made of at least one of a silicon substrate, a glass substrate and a flexible substrate, for example.

The gate electrode 120 is configured to receive a gate voltage, and may be made of a conductive material, for example, a metal material.

The gate insulating layer 125 functions as a dielectric layer, and may be made of at least of a silicon-based dielectric material and a metal oxide-based dielectric material, for example. The thickness of the gate insulating layer 125 may be determined according to the operating range of the gate voltage applied. For example, when the operating range of the gate voltage is low, the thickness of the insulating layer 130 may be thinner compared to when the operating range of the gate voltage is high.

At least one of the first and second barriers 130 and 150 may comprise at least one of an organic material, an inorganic material, and an organic-inorganic composite material. When the barrier comprises an organic material, the barrier may comprise at least one of 4MP (4-mercaptophenol) and Zn4MP (Zinc 4-mercaptophenol). When the barrier layer comprises an organic-inorganic composite material, the barrier may comprise 4MP with an Al linker, that is, Al4MP.

Hereinafter, for convenience of description, it is assumed that the first and second barriers 130 and 150 are Zn4MP.

The barrier may protect the active monolayer. For example, when other layer is formed after formation of the active monolayer 140, the second barrier 150 may prevent the active monolayer 140 from being unintentionally doped or prevent a precursor for deposition of the other layer from penetrating into the active monolayer 140.

The active monolayer 140 may include a metal oxide, for example, ZnO. According to one embodiment, the active monolayer 140 may have a two-dimensional layered structure. In this case, the two-dimensional layered structure of the active monolayer 140 may form a superlattice structure through a predetermined stacking.

According to one embodiment, the thickness of the active monolayer 140 may be in the range in which FET (Field Effect Transistor) characteristics appear. For example, when the active monolayer comprises zinc oxide, it may have a thickness of 1.5 nm or more. If the thickness of the zinc oxide is smaller than 1.5 nm, the zinc oxide may lose FET characteristics. In addition, the thickness of the active monolayer may be 20 nm or less. If the thickness of the active monolayer is thicker than 20 nm, it may be disadvantageous in terms of power consumption due to an increase in the operating voltage. In addition, since the gate insulating layer 125 needs to be thicker in order to withstand a large gate voltage, it does not meet the trend of miniaturization of the device.

With continued reference to FIG. 1, at least one active monolayer and at least one barrier may be alternately stacked. In this case, a barrier may be provided on at least one surface of the active monolayer. If barriers are provided on both one side and the other side of the active monolayer, the active monolayer may have a structure sandwiched between the first and second barriers. In another aspect, at least one surface of the active monolayer 140 may directly contact the barrier. That is, one surface of the active monolayer 140 may contact the first barrier 130 and the other surface may contact the second barrier 150. Hereinafter, for convenience of description, it is assumed that the first barrier 130 and the second barrier 150 are respectively positioned on both surfaces of the active monolayer 140.

According to an example, each of the first barrier 130, the active monolayer 140, and the second barrier 150 may have a thickness of several nanometers.

According to one embodiment, the active monolayer and the barrier adjacent to the active monolayer may form a hybrid superlattice structure. The superlattice structure may increase stability.

According to one embodiment, the barrier may form an interface with the active monolayer, and thus the active monolayer between the barriers may form a quantum well.

According to one example, as shown in FIGS. 2 and 3, the active monolayer 140 may be composed of a layer including an amorphous region (AM_R) and a plurality of crystalline regions (NC_R) surrounded by the amorphous region (AM_R). Namely, in the active monolayer, the amorphous region (AM_R) and the crystalline regions (NC_R) may be present together.

In this case, each of the crystalline regions (NC_R) has a nanometer size and may show a quantum confinement effect. Specifically, the crystalline regions (NC_R) may have a size of a few nm, for example, about 3 nm, and the average distance between the crystalline regions may be about 2.5 nm. In other words, the crystalline regions (NC_R) may be spaced apart from one another at an average distance of about 2.5 nm, and may have island shapes surrounded by the amorphous region (AM_R). In addition, the crystalline regions (NC_R) may be randomly distributed in a two-dimensional plane in the amorphous region (AM_R). Accordingly, the crystalline regions (NC_R) may exhibit a quantum confinement effect in a triaxial direction. Namely, the crystalline regions (NC_R) may exhibit the quantum confinement effect not only in a thickness direction but also in a plane direction.

A current saturation region (Vs region in FIG. 12) may be generated by triaxial quantization of the active monolayer. For a detailed description, reference will be made to FIGS. 4 and 5.

Figure 4:
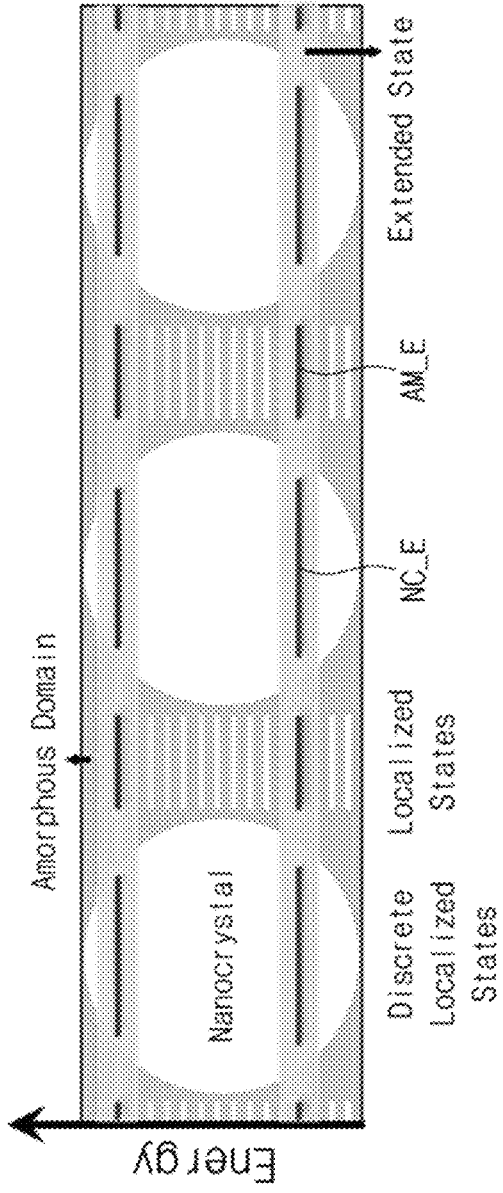
FIGS. 4 and 5 are diagrams for illustrating an active monolayer in detail according to a first embodiment of the present invention.
Figure 5:
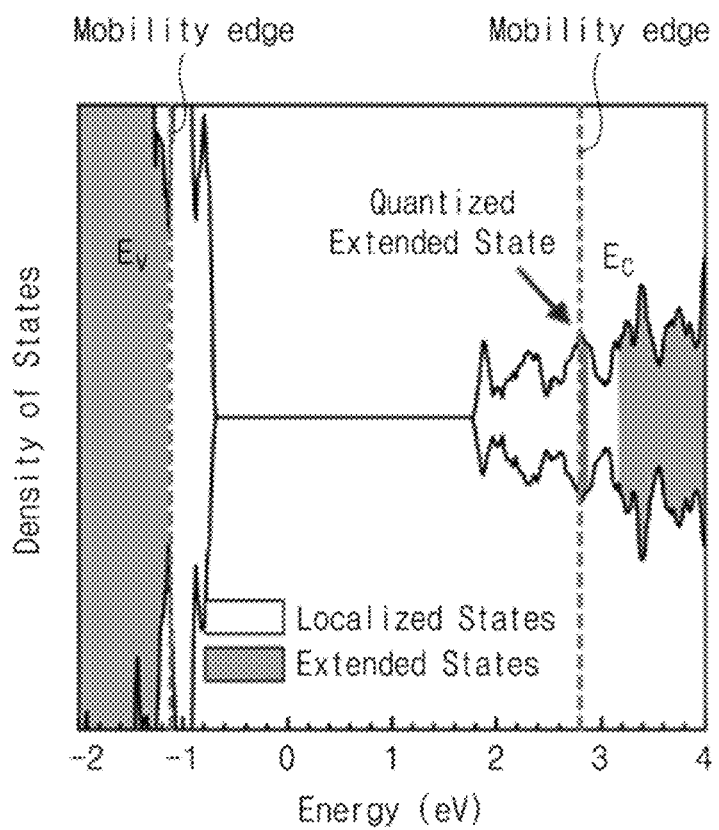
Figure 6:
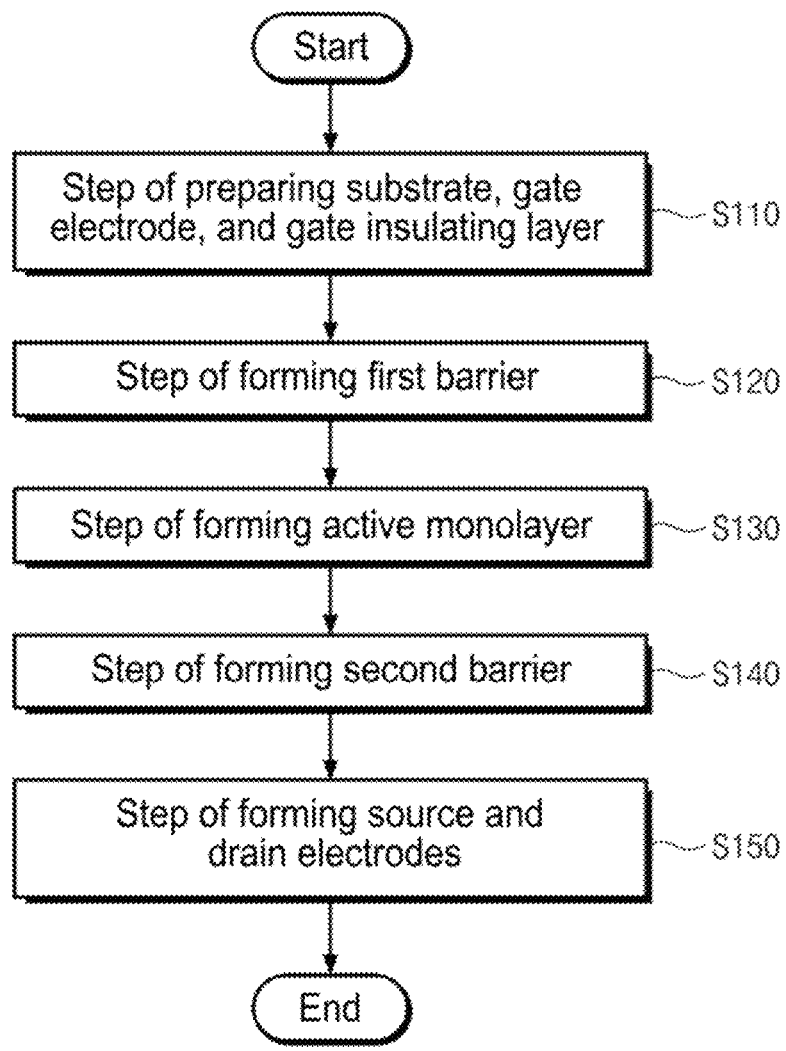
FIGS. 6 to 9 are diagrams for illustrating a method of manufacturing a device according to a first embodiment of the present invention.

FIGS. 4 and 5 are diagrams for illustrating in detail an active monolayer according to a first embodiment of the present invention.

Referring to FIG. 4, the amorphous region (AM_R) of the active monolayer 140 may have a large number of localized states. Unlike this, the crystalline regions (NC_R) of the active monolayer 140 may have a smaller number of discrete localized states than the localized states of the amorphous region (AM_R). In this case, there may be resonant energy matching between a specific energy state (AM_E) among the localized energy states of the amorphous region (AM_R) and a specific energy state (NC_E) among the localized energy states of the crystalline regions (NC_R).

Hybridization caused by the resonant energy matching may provide quantized conduction states. The quantized conduction states may exhibit limited current flow while showing conduction states. The quantized conduction states will now be described in more detail with reference to FIG. 5.

FIG. 5 shows Density Of States (DOS) according to one embodiment of the present invention. For reference, the results of DOS simulation can be obtained by performing calculation on a formed active monolayer by PBE (Perdew-Burke-Emzerhof) exchange-correlation functional and PAW (projector-augmented wave) pseudopotentials methods using the VASP (Vienna ab initio simulation) program.

DOS in FIG. 5 indicates the change in the number of electron states by an increase in electron energy. As shown in FIG. 5, the active monolayer 140 may have a valence band and a conduction band.

The valence balance may be divided into an extended state (non-localized state) and a localized state by a mobility edge. In addition, the conduction band may also be divided into an extended state and a localized state by a mobility edge.

As shown in FIG. 5, the active monolayer 140 according to one embodiment of the present invention may exhibit a first number of electron states in a low-level electron energy range (about 2.8 eV to 2.9 eV) in the conduction band, and exhibit a second number of electron states in a high-level electron energy range (about 3.2 eV or higher) higher than the low-level electron energy range in the conduction band.

At this time, a curve of the first electron state number in the low-level electron energy range and a curve of the second electron state number in the high-level electron energy range may be discontinuous with each other. In other words, the maximum electron energy value (about 2.9 eV) in the low-level electron energy range may be smaller than the minimum electron energy value (about 3.2 eV) in the high-level electron energy range. Here, the maximum value of the first electron state number in the low-level electron energy range may be smaller than the minimum value of the second electron state number in the high-level electron energy range.

According to one embodiment, the low-level electron energy range and the high-level electron energy range can be provided at higher energy than the mobility edge in the conduction band (i.e. mobility edge quantization). This can mean that the energy level of localized states in the amorphous region (AM_R) of the active monolayer 140 and the energy level of localized states in the crystalline regions match each other above the mobility edge. Accordingly, the active monolayer 140 may exhibit conduction states in the low-level electron energy range and the high-level electron energy range. At this time, the conduction states in the low-level electron energy range having the first electron state number above the mobility edge may be defined as quantized extended states.

In addition, there may be a localized state (i.e., an electron state number of 0) between the low-level electron energy range and the high-level electron energy range. This can mean that the crystalline regions (NC_R) of the active monolayer have no energy state between the low-level electron energy level and the high-level electron energy level. Accordingly, the resonant energy of the crystalline regions (NC_R) and the resonant energy of the amorphous region (AM_R) do not match each other between the low-level electron energy range and the high-level electron energy level.

According to one embodiment, as described above, the low-level electron energy range may be provided by resonant energy matching between the crystalline regions (NC_R) and amorphous region (AM_R) of the active monolayer 140. At this time, the crystalline region (NC_R) has a quantum confinement effect in a triaxial direction, and thus a curve defined by the low-level electron energy range and the first electron state number may have a very limited area. This can mean that a very limited number of carriers can exist.

That is, since the active monolayer 140 has a limited number of electron states in a low-level energy state, a current saturation state (region Vs in FIG. 12) may be provided.

Referring back to FIG. 1, the source and drain electrodes 160 and 162 may contact the uppermost barrier. In another aspect, the source and drain electrodes 160 and 162 may contact the uppermost second barrier 150 and may not contact the first barrier 130 and the active monolayer 140.

The device according to the first embodiment of the present invention has been described above from a structural point of view. Hereinafter, a method of manufacturing a device according to a first embodiment of the present invention will be described with reference to FIGS. 6 to 9.

FIGS. 6 to 9 are views for illustrating a method of manufacturing a device according to the first embodiment of the present invention.

Figure 9:
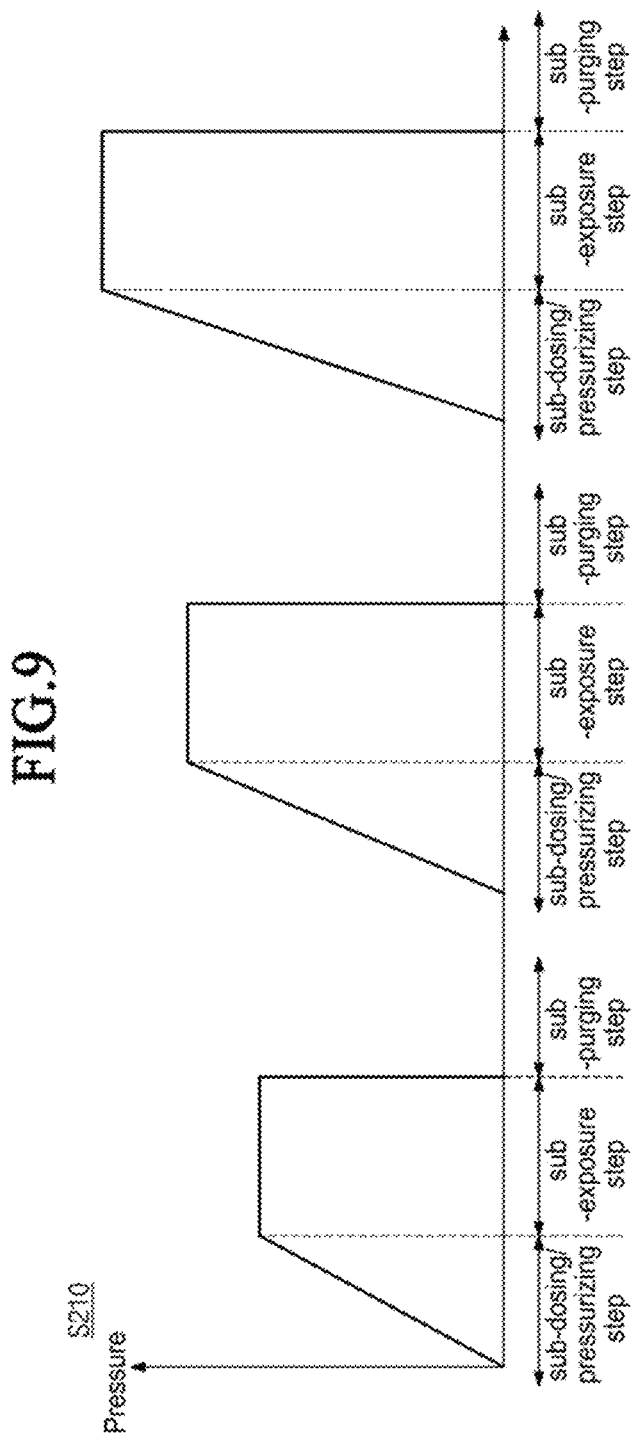

Referring to FIG. 9, a method of fabricating a device according to one embodiment of the present invention may comprise at least one of preparing a substrate, a gate electrode, and a gate insulating layer (S110), forming a first barrier (S120), forming an active monolayer (S130), forming a second barrier (S140), and forming a source and drain electrodes (S150). Hereinafter, each of the steps will be described in detail.

Step S110

Step S110 is a preparation step, and may comprise the steps of preparing a substrate, forming a gate electrode on the substrate, and forming a gate insulating layer on the gate electrode.

Step S120

A first barrier may be formed on the gate insulating layer. The first barrier may be formed by a molecular layer deposition (MLD) method. For example, when Zn4MP is deposited by the molecular layer deposition method, the molecular layer deposition method may comprising a DEZ precursor dosing step, a purging step, a 4MP precursor dosing step, and a purging step. As a result, the first barrier 130 may be deposited.

Step S130

In step S130, an active monolayer 140 may be deposited. Step S130 will be described in detail with reference to FIG. 7.

Figure 7:
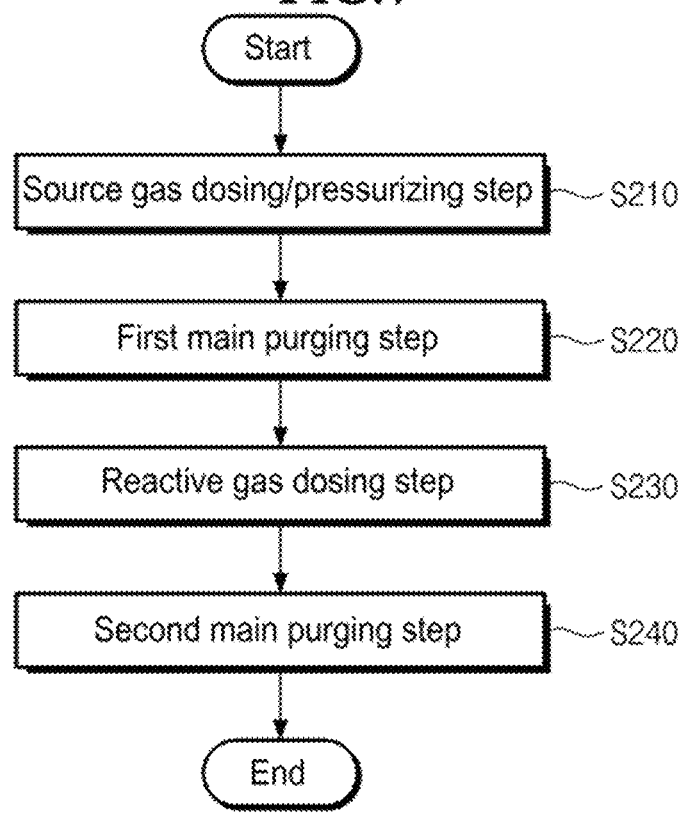

FIG. 7 is a flow chart illustrating in detail step S130 according to one embodiment of the present invention.

Referring to FIG. 7, a method of forming an active monolayer according to one embodiment of the present invention may comprise at least one of a source gas dosing/pressurizing step (S210), a first main purging step (S220), a reactive gas dosing step (S230), and a second main purging step (S240). Hereinafter, each of the steps will be described in detail.

Step S210

For the source gas dosing/pressurizing step (S210), a source gas may be prepared. The kind of source gas to be prepared may vary depending on the type of layer to be deposited. For example, when a layer to be deposited is a metal oxide layer, a metal precursor source gas corresponding thereto may be prepared. For example, when a layer to be deposited is a zinc oxide (ZnO) layer, the source gas may comprise DEZ (diethyl zinc).

The source gas may be dosed into a chamber in a state in which the chamber outlet is closed. Accordingly, as the source gas is introduced into the chamber, the pressure in the chamber can increase. In other words, the pressure in the chamber is increased by dosing of the source gas, and hence the source gas may be adsorbed onto the substrate in a pressurized atmosphere. In addition, the increased pressure in the chamber may be maintained for a predetermined time. Accordingly, the efficiency of adsorption onto the substrate can be increased.

At this time, the increased pressure in step S210 may be higher than 0.03 Torr, preferably, 0.1 Torr or higher, and more preferably 0.3 Torr or higher. In addition, step S210 may be performed at a temperature of 80° C. to 250° C., for example 100° C. to 150° C.

Step S220

In the first main purging step (S220), inert gas may be used. The inert gas may be, for example, argon (Ar) or nitrogen ($N_2$) gas. Through the purging step, an excess of the source gas that has not been adsorbed onto the substrate surface may be removed.

Step S230

In the reactive gas dosing step (S230), a reactive gas may react with the source gas to form the layer to be deposited. For example, when the source gas comprises DEZ, the reactive gas may comprise $H_2O$.

Step S240

After the reactive gas dosing step, the second main purging step (S240) may further be performed. This can remove an excess of the gas that has not been adsorbed onto the substrate surface.

Step S210 to step S240 according to one embodiment of the present invention have been described above. Hereinafter, dosing/pressurizing of step S210 will be described in detail.

Dosing/Pressurizing of Step S210

The source gas dosing/pressurizing step (step S210) may be performed in a pressurized atmosphere. In other words, the source gas dosing/pressurizing step may be performed in a high-pressure atmosphere, and may be abbreviated as "pressurizing step".

Although the source gas dosing/pressurizing step (step S210) will be described in detail, for the sake of brevity, it should be understood that dosing/pressurizing may also be performed in the reactive gas dosing step (step S230).

According to one embodiment, the dosing/pressurizing step may be performed in a state in which a chamber having a substrate loaded therein is closed. For example, a discharge valve of the chamber is closed, and in this state, a metal precursor source gas may be dosed into the chamber (sub-dosing/pressurizing step), thereby inducing high pressure in the chamber. The induced high pressure may be maintained (sub-exposure step). When the high pressure is maintained for a predetermined time, the metal precursor source gas may be adsorbed onto the substrate surface in a high-pressure atmosphere.

In other words, the dosing/pressurizing step may comprise at least one of a sub-dosing/pressurizing step, a sub-exposure step and a sub-purging step. The sub-dosing/pressurizing step may be defined as a step of dosing the source gas into the chamber in a state in which the outlet of the chamber is closed, thereby causing the pressure in the chamber to reach a predetermined pressure. The sub-exposure step is a step of maintaining the predetermined pressure provided by the sub-dosing/pressurizing step. To this end, the inlet and outlet of the chamber may all be closed. Namely, the chamber may be closed. The sub-purging step may be performed after the sub-exposure step to remove an excess of the source gas dosed.

Figure 8:
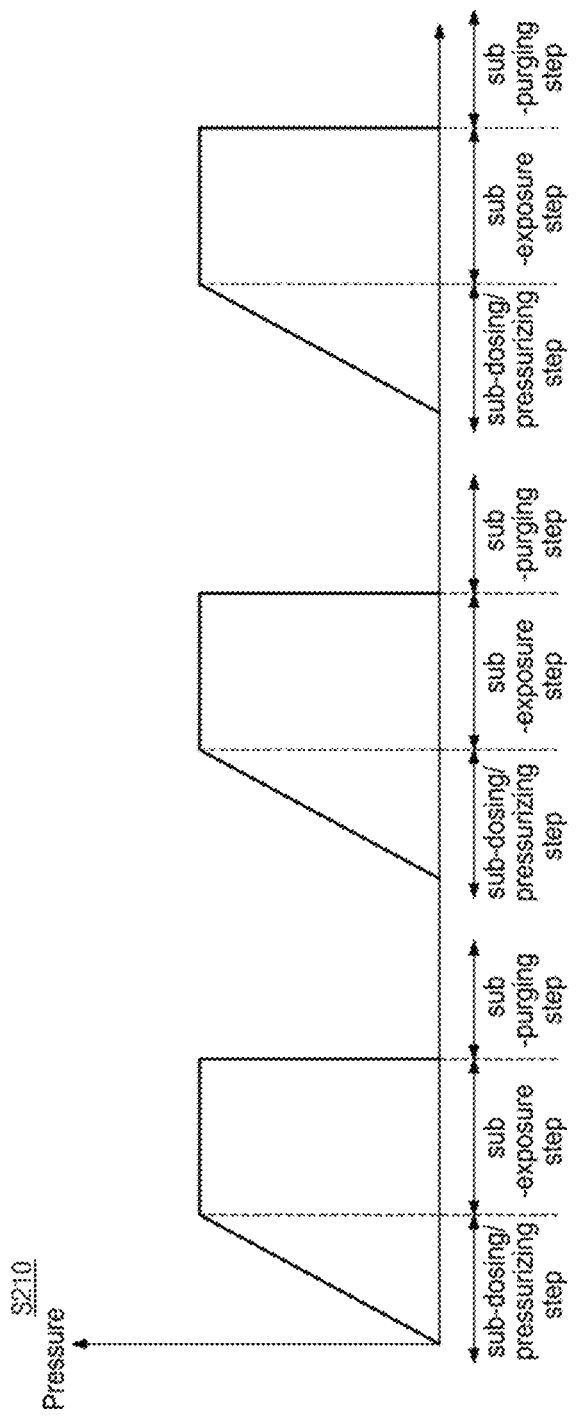
Figure 17:
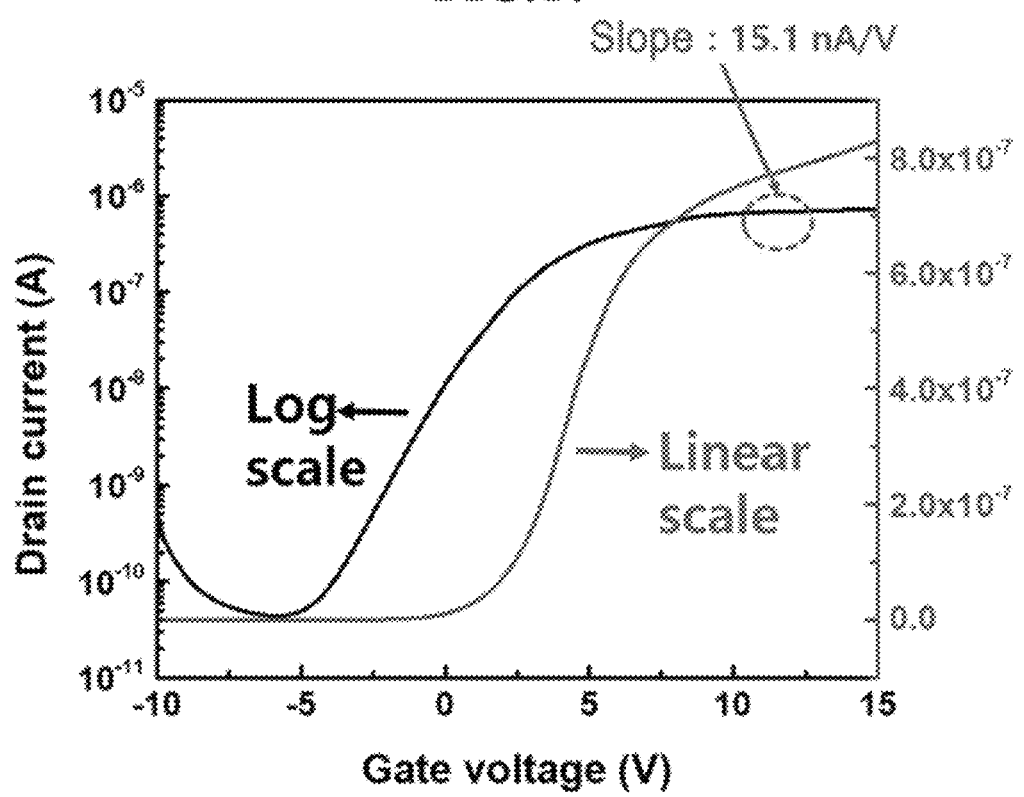

As shown in FIG. 8, the pressure in the sub-exposure step may be maintained at a constant level, even when the number of the sub-exposure steps increases. Unlike this, as shown in FIG. 9, the pressure in the sub-exposure step may increase as the number of the sub-exposure steps increases. For reference, the Y-axis in FIG. 17 represents pressure, and the X-axis represents process steps.

According to one embodiment, step S210 may be performed at a temperature of 80° C. to 250° C., specifically 100° C. to 150° C.

In addition, sub-steps of step S210 may be performed at the same temperature. In particular, these sub-steps may be performed at low temperature. As used herein, the term "low temperature" refers to a temperature of 250° C. or below.

Through the steps S210 to S240 described above, the active monolayer 140 may be deposited. At this time, the thickness of the layer deposited may be controlled depending on the number of repetition of steps S210 to S240. For example, when the layer to be deposited is a zinc oxide layer, steps S210 to S240 may be repeated such that the thickness of the layer exceeds 1.5 nm. In addition, when the layer to be deposited is a zinc oxide layer, steps S210 to S240 may be repeated such that the thickness of the layer is 20 nm or less.

The active monolayer formed according to steps S210 to S240 can exhibit the DOS simulation results as shown in FIG. 5. In other words, the active monolayer can exhibit quantized conduction states. More specifically, it can exhibit quantized conduction states at energy higher than the mobility edge. As described above, the DOS simulation results can be obtained by performing calculation on the formed active monolayer by the PBE (Perdew-Burke-Emzerhof) exchange-correlation functional and PAW (projector-augmented wave) pseudopotentials methods using the VASP (Vienna ab initio simulation) program.

Step S140

Referring back to FIG. 6, a second barrier 150 may be deposited on the active monolayer 140. Step S140 corresponds to the above-described step S120, and thus the detailed description thereof will be omitted.

Step S150

On the second barrier 150, source and drain electrodes 160 and 162 may be deposited. That is, the source and drain electrodes 160 and 162 may contact the second barrier 150. In another aspect, the source and drain electrodes 160 and 162 may not contact the first barrier 130 and the active monolayer 140.

The device according to the first embodiment of the present invention may be manufactured by steps S110 to S150 described above.

The method of manufacturing the device according to the first embodiment of the present invention has been described above with reference to FIGS. 6 to 9. The method of manufacturing a device according to an exemplary embodiment of the present invention has advantages in that the process is performed at a low temperature as a whole and that a hybrid superlattice structure can be easily manufactured.

Hereinafter, operating characteristics of the device according to the first embodiment of the present invention will be described with reference to FIGS. 10 to 12.

Figures 10, 11:
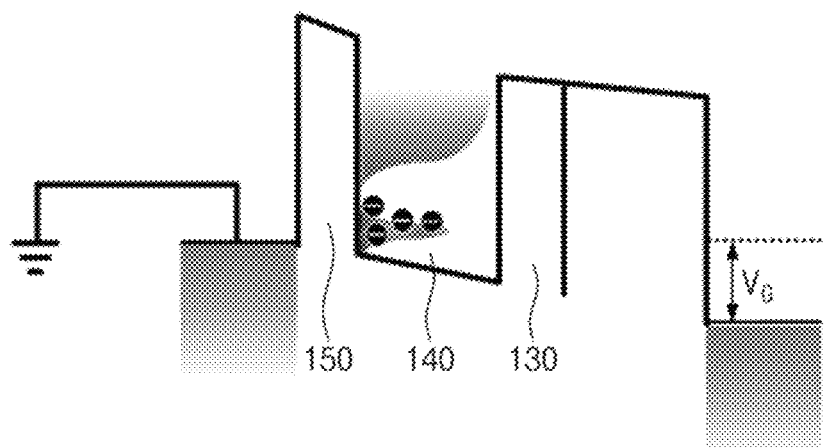
FIGS. 10 to 12 are diagrams for illustrating the operating characteristics of the device according to a first embodiment of the present invention.
Figure 12:
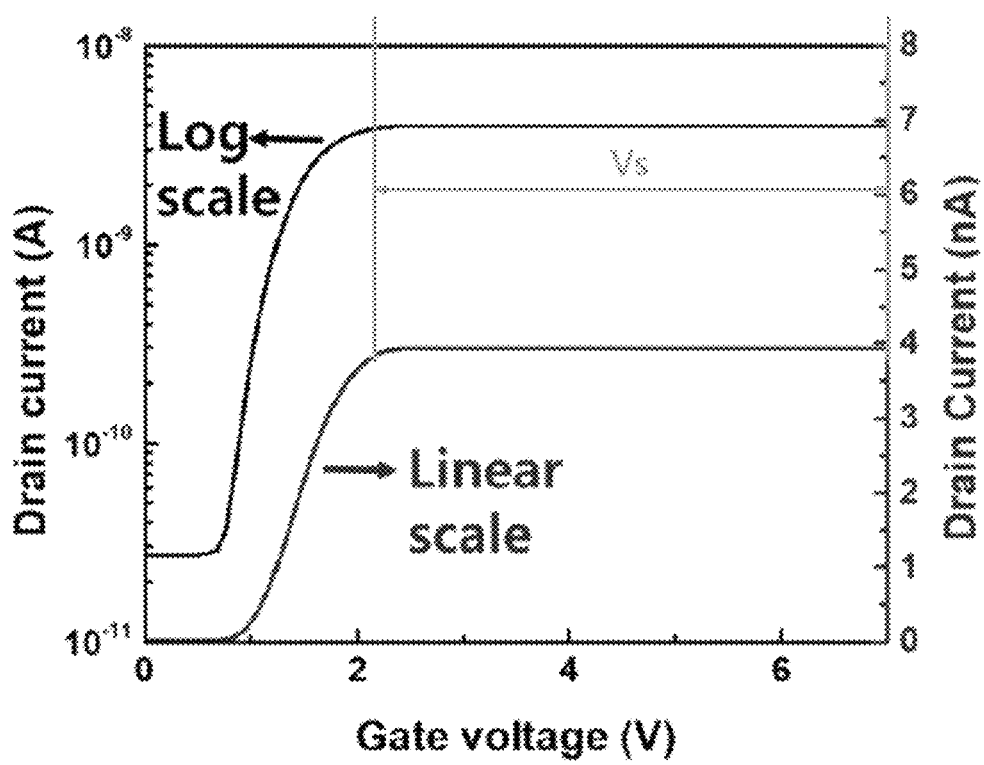

FIGS. 10 to 12 are diagrams for illustrating the operating characteristics of the device according to the first embodiment of the present invention.

First, in order to examine the operating characteristics of the device according to the first embodiment of the present invention, a device according to the first embodiment of the present invention was manufactured.

Zn4MP was deposited as the first barrier 130 through step S120 of the manufacturing method described above. More specifically, DEZ was provided at a pressure of 30 mTorr for 2 seconds, and purged for 20 seconds. Thereafter, 4MP was provided at a pressure of 10 mTorr for 20 seconds and purged for 200 seconds. The process temperature was set to 120 degrees. Each step of step S120 was repeated 25 cycles to deposit a first barrier 130 having a thickness of 10 nm.

After depositing the first barrier 130 through step S120, step S130 was performed according to the process shown in FIG. 10. Referring to FIG. 10, DEZ was prepared as a source gas, and H$_2$O was prepared as a reaction gas. DEZ was provided through the sub-pressure dosing steps according to step S210. Specifically, in the first sub-dosing/pressurizing step, DEZ was supplied while the outlet of the chamber was closed, thereby increasing the pressure in the chamber to 1 Torr, and the chamber was maintained for 3 seconds in an atmosphere pressurized at a pressure of 1 Torr, followed by purging for 15 seconds. Next, in the second sub-dosing/pressurizing step, DEZ was supplied while the outlet of the chamber was closed, thereby increasing the pressure in the chamber to 1 Torr, and the chamber was maintained for 3 seconds in an atmosphere pressurized at a pressure of 1 Torr, followed by purging for 15 seconds. Next, in the third sub-dosing/pressurizing step, DEZ was supplied while the outlet of the chamber was closed, thereby increasing the pressure in the chamber to 1 Torr, and the chamber was maintained for 3 seconds in an atmosphere pressurized at a pressure of 1 Torr. Then, purging was performed for 15 seconds, and a fourth sub-dosing/pressurizing step was performed. The pressure in the chamber in the fourth sub-dosing/pressurizing step was 1 Torr. Thus, step S210 was performed. Following step S210, steps S220 and S230 were performed. Since step S230 corresponds to step S210, a detailed description will be omitted. After step S230, it was purged through step S240. These steps were defined as 1 cycle, and 15 cycles were carried out. As a result, an active monolayer 140 having a thickness of 3 nm could be deposited. The deposition process of the active monolayer 140 was also set at 110 to 120 degrees.

Next, according to step S130, a second barrier layer 150 was deposited; and according to step S140, source and drain electrodes were deposited.

As a result, a device according to the first embodiment of the present invention was fabricated.

Referring to FIG. 11, in the device according to the first embodiment of the present invention, the first and second barriers 130 and 150 and the active mono layer 140 may form a quantum well structure. At this time, since the active monolayer 140 has a quantum confinement effect in the three-axis direction, current flow may be limited.

Referring to FIG. 12, the device 100a manufactured according to the first embodiment of the present invention has a turn-on voltage around 1V. That is, as a voltage of 1V or more is applied to the gate electrode 120, a current flows between the source and drain electrodes 160 and 162. In this case, as the gate voltage applied to the gate electrode 120 increases, the current flowing between the source and drain electrodes 160 and 162 increases. However, when the gate voltage increases to 2V or more, a current saturation region Vs in which the current between the source and drain electrodes 160 and 162 is constant despite an increase in the gate voltage appears. The current saturation region where the current is constant can be clearly observed in the linear scale and log scale. That is, despite the swing of the gate voltage, the current between the source and drain electrodes is saturated. As described with reference to FIGS. 4 and 5, it is interpreted that this is because the active monolayer 140 has a quantum confinement effect in the three-axis direction. From another viewpoint, it is interpreted that this is because the active monolayer 140 may have very limited carriers in the low-level electron energy range on the DOS.

The device according to the first embodiment of the present invention has been described above with reference to FIGS. 1 to 12.

In describing the first embodiment of the present invention, it is assumed that the active monolayer 140 includes ZnO, that is, a metal oxide. However, the active monolayer 140 may be made of a material having a plurality of crystalline regions and an amorphous region surrounding the crystalline region, as well as a material having a limited (discontinuous) low-level electron energy region above the mobility edge on DOS.

Hereinafter, a device according to a second embodiment of the present invention will be described with reference to FIGS. 13 to 17. The second embodiment of the present invention is different from the first embodiment of the present invention in that the active monolayer includes an elementary metal. Hereinafter, a description will be given of the second embodiment of the present invention focusing on the differences, and descriptions of parts in common with the first embodiment will be omitted.

Figure 13:
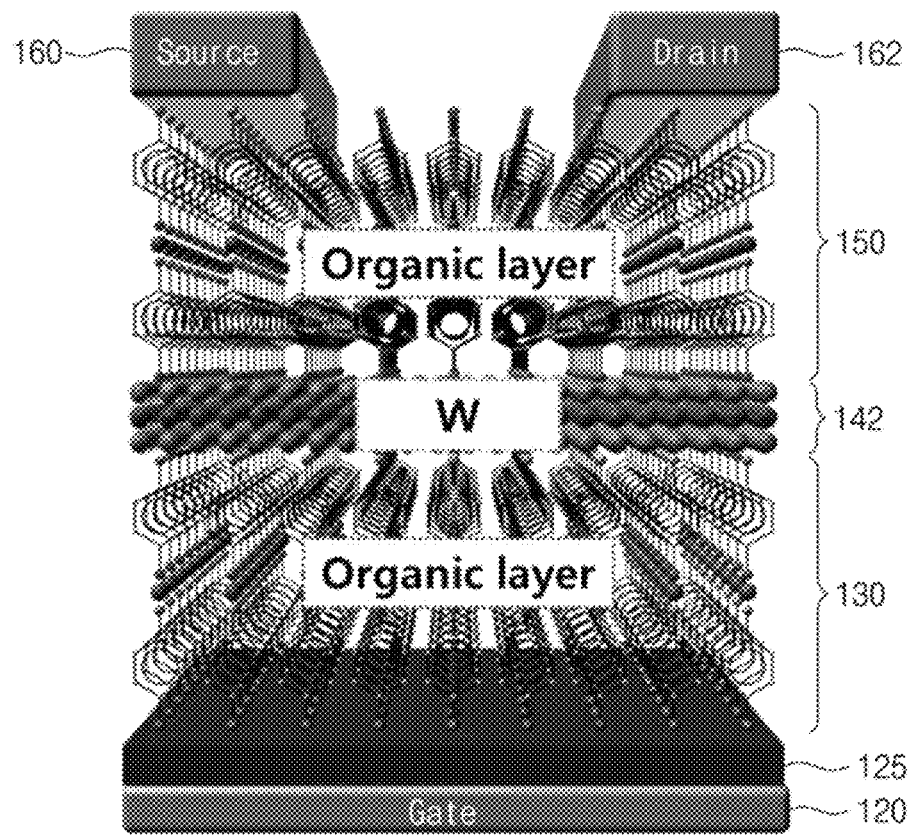
FIGS. 13 and 14 are diagrams for illustrating a device according to a second embodiment of the present invention.
Figure 14:
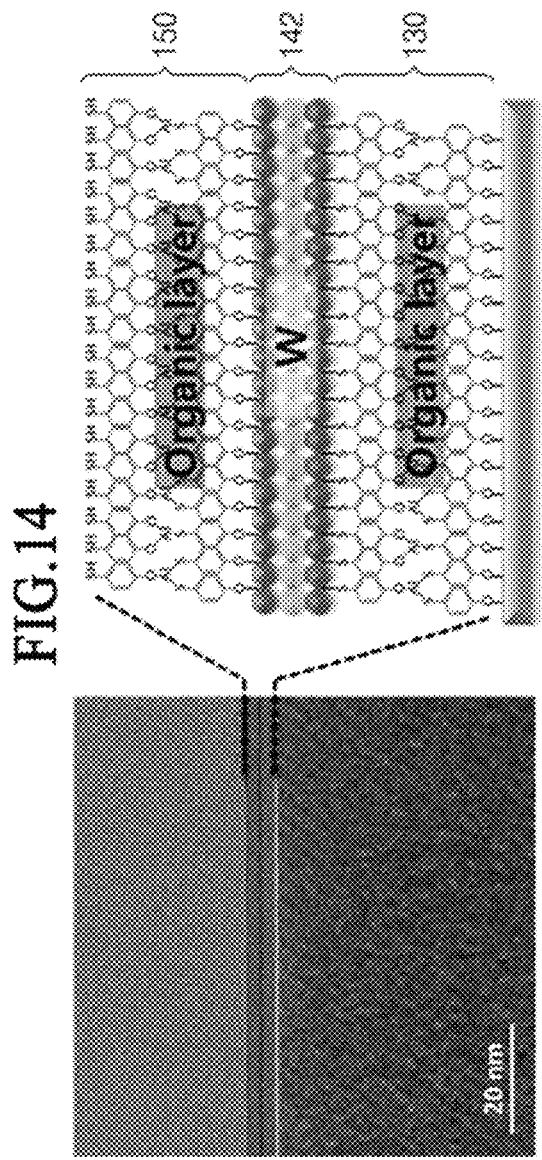

FIGS. 13 and 14 are diagrams for illustrating a device according to a second embodiment of the present invention.

Referring to FIGS. 13 and 14, an active monolayer 142 of a device 100b according to the second embodiment of the present invention may include an elementary metal. For example, the elementary metal may be one of tungsten (W), molybdenum (Mo), and copper (Cu), but is not limited thereto.

The active monolayer 142 may also have a thickness of several nanometers. For example, the thickness of the active monolayer 142 may also be within a range in which field effect transistor (FET) characteristics appear. More specifically, the thickness of the active monolayer 142 may be 1.0 nm to 20 nm.

As described in the first embodiment, the active monolayer 142 according to the second embodiment may also have a quantum well structure and may have a hybrid superlattice structure. In addition, the active monolayer 142 may have a quantized state in at least one axis, for example, in a short axis direction. Accordingly, current flow can be limited even above the turn-on voltage. More specifically, a slope of current flowing between the source and drain electrodes may be 15.1 nA/V or less as the gate voltage increases.

Figures 15, 16:
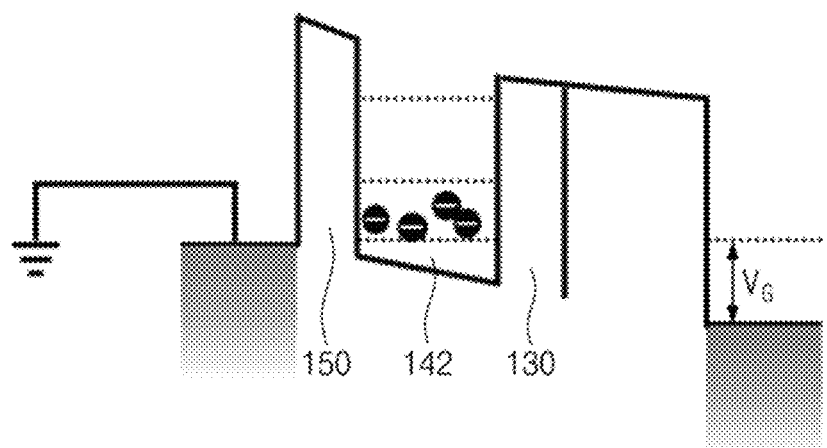
FIGS. 15 to 17 are diagrams for illustrating operating characteristics of a device according to a second embodiment of the present invention.

FIG. 15 is a diagram for illustrating a method of manufacturing a device according to a second embodiment of the present invention.

In order to examine the operating characteristics of the device according to the second embodiment, the device according to the second embodiment was manufactured according to the method of manufacturing the device previously described with reference to FIGS. 6 to 9. Except for the active monolayer 142, the manufacturing process conditions of the device according to the first embodiment described with reference to FIG. 10 were the same. A detailed process of the active monolayer 142 according to the second embodiment is as shown in FIG. 15.

Referring to FIG. 15, in step S210, WF$_6$ was prepared as a source gas. The process temperature of step S210 was set to 120 degrees. Step S210 was performed, but WF$_6$ was provided by sub-dosing/pressurizing 5 times. That is, during the first-dosing/pressurizing, WF$_6$ was provided with the outlet of the chamber closed, thereby increasing the pressure of the chamber to 1.0 Torr. After that, the inlet of the chamber was also closed for 30 seconds, and WF$_6$ was infiltrated at a pressure of 1.0 Torr. After that, the sub-purging was performed for 30 seconds. Thereafter, during the second sub-dosing/pressurizing, WF$_6$ was provided with the outlet of the chamber closed, and the pressure in the chamber was again increased to 1.0 Torr. After that, the inlet of the chamber was also closed for 30 seconds, and WF$_6$ was infiltrated at a pressure of 1.0 Torr. In the same manner, it was performed up to the fifth sub-dosing/pressurizing step, the fifth sub-infiltration step.

Thereafter, the first main purging (process temperature 120 degrees) was performed according to step S220 for 30 seconds.

Thereafter, according to step S230, $Si_2H_6$ was prepared as a reaction gas. The process temperature of step S230 was set to 120 degrees.

Step S230 was performed, but $SiH_6$ was provided in 5 sub-dosing/pressurizing and sub-exposure steps. At this time, process variables such as pressure and time were the same as those of $WF_6$ dosing.

Thereafter, a second main purging (process temperature of 120 degrees) was performed for 30 seconds according to step S240.

At this time, the height of the tungsten layer was controlled by repeating steps S210 to S240. In this experimental example, 3 cycles were repeated to prepare a 1 nm-thick tungsten metal monoatomic layer. Thereby, an active monolayer could be deposited.

FIGS. 16 and 17 are diagrams for explaining operating characteristics of a device according to a second embodiment of the present invention.

Referring to FIG. 16, in the device 100b according to the second embodiment of the present invention, first and second barriers 130 and 150 and an active monolayer 142 may form a quantum well structure. In this case, since the active monolayer 140 has a quantum confinement effect in a short axis direction (e.g., a thickness direction), current flow may be limited.

Referring to FIG. 17, the device manufactured according to the second embodiment of the present invention has a turn-on voltage around –5V. That is, as a voltage of –5V or more is applied to the gate electrode 120, a current flows between the source and drain electrodes 160 and 162. At this time, as the gate voltage applied to the gate electrode 120 increases, the current flowing between the source and drain electrodes 160 and 162 increases. However, when the gate voltage increases to about 7V or more, it can be seen that a region in which an increase in current between the source and drain electrodes 160 and 162 is restricted appears despite an increase in the gate voltage. That is, it can be seen that despite the swing of the gate voltage, the current increase between the source and drain electrodes is extremely limited to 15.1 nA/V. It is interpreted that this is because the active monolayer 142 has an energy level quantized in the short axis direction.

The device according to the second embodiment of the present invention has been described above with reference to FIGS. 13 to 17. Hereinafter, a device according to a third embodiment of the present invention will be described with reference to FIGS. 18 to 22. The third embodiment of the present invention is different from the first embodiment of the present invention in that the active monolayer includes a transition metal dichalcogenide (TMDC). Hereinafter, a third embodiment of the present invention will be described centering on the differences, and descriptions of parts in common with the first embodiment will be omitted.

Figure 18:
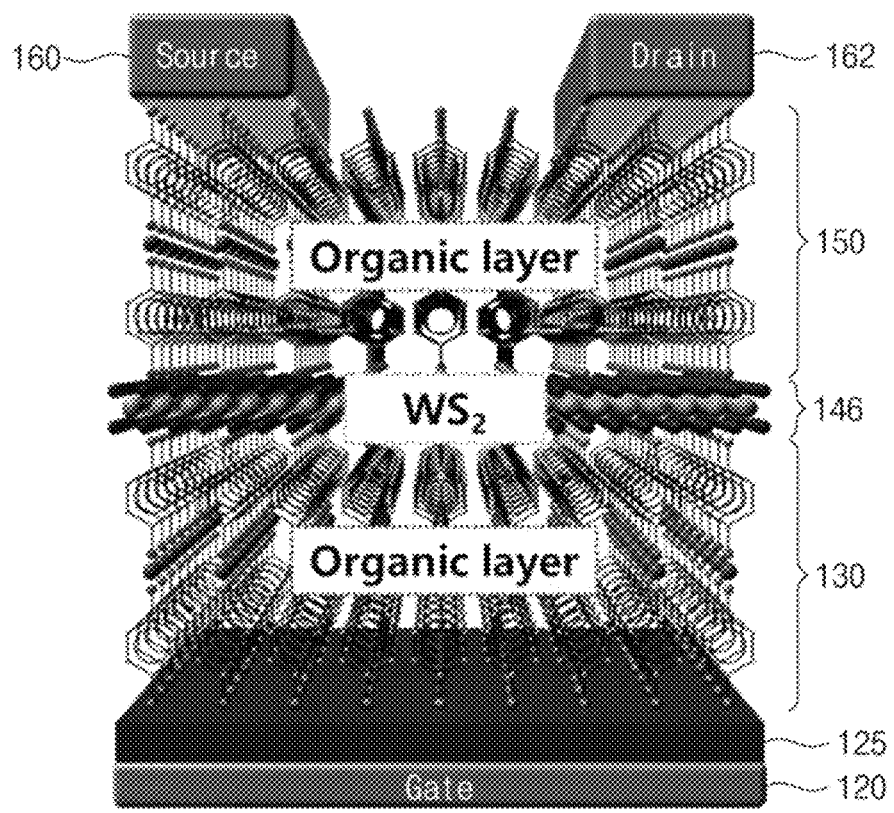
FIGS. 18 and 19 are diagrams for illustrating a device according to a third embodiment of the present invention.
Figure 19:
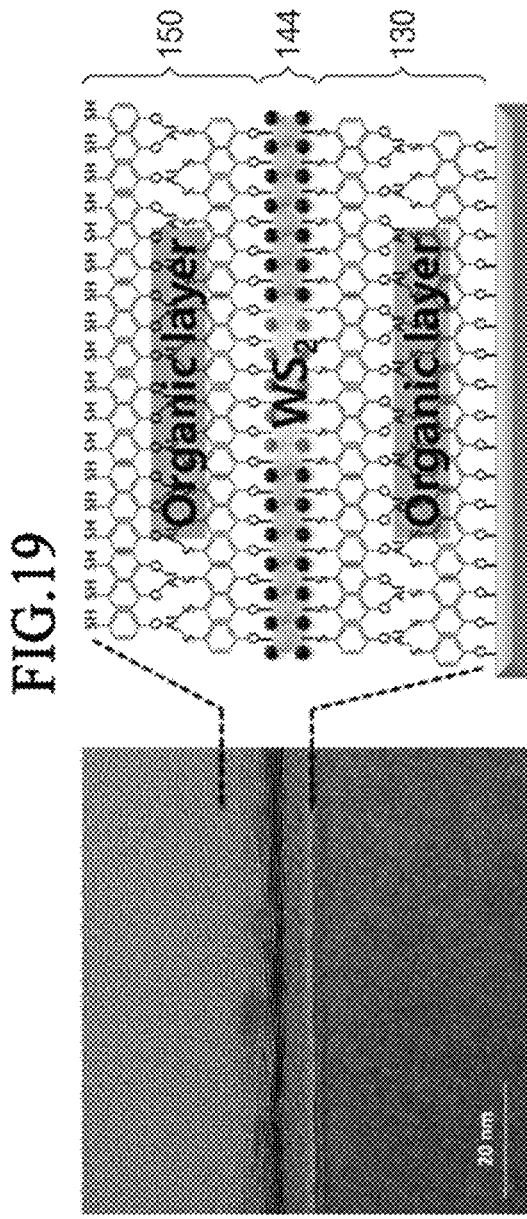

FIGS. 18 and 19 are diagrams for illustrating a device according to a third embodiment of the present invention.

Referring to FIGS. 18 and 19, the active mono layer 146 of the device 100c according to the third embodiment of the present invention may include TMDC. For example, TMDC may be one of $WS_2$ and $MOS_2$, but is not limited thereto.

The active monolayer 146 may also have a thickness of several nanometers. The active monolayer 146 may also have a thickness of several nanometers. For example, the thickness of the active monolayer 142 may also be within a range in which field effect transistor (FET) characteristics appear. More specifically, the thickness of the active monolayer 142 may be 1.0 nm to 20 nm.

As described in the first embodiment, the active monolayer 146 according to the third embodiment may also have a quantum well structure and may have a hybrid superlattice structure. In addition, the active monolayer 146 may have a quantized state in at least one axis, for example, in a short axis direction. Accordingly, current flow can be limited even above the turn-on voltage. More specifically, a current slope between the source and drain electrodes as the gate voltage increases may be –0.2 nA/V or less.

Figures 20, 21:
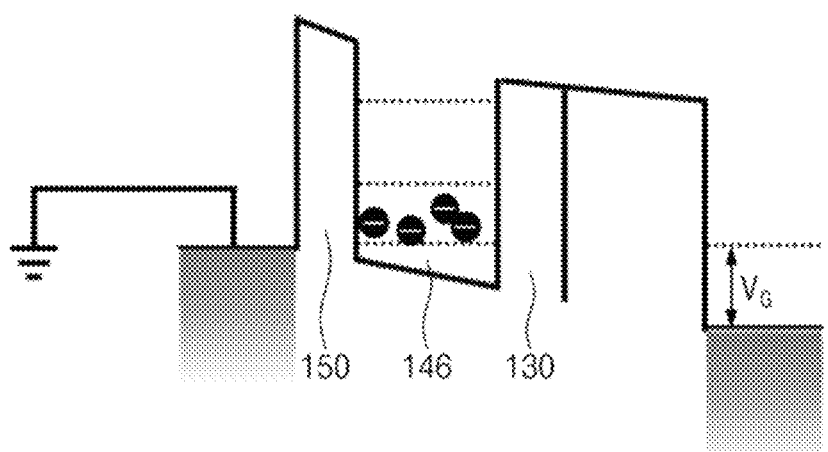
FIGS. 20 to 22 are diagrams for illustrating operating characteristics of a device according to a third embodiment of the present invention.

FIG. 20 is a view for illustrating a method of manufacturing a device according to a third embodiment of the present invention.

In order to examine the operating characteristics of the device according to the third embodiment, the device according to the third embodiment was manufactured according to the method of manufacturing the device previously described with reference to FIGS. 6 to 9. Except for the active monolayer 146, the manufacturing process conditions of the device according to the first embodiment described with reference to FIG. 10 were the same. A detailed process of the active monolayer 146 according to the third embodiment is as shown in FIG. 15.

Referring to FIG. 15, chalcogen source gas was heated to 100 degrees or more and provided for 30 seconds, followed by purging for 30 seconds. Thereby, a substrate surface was treated with S (sulfur).

In step S210, $WF_6$ was prepared as a source gas. The process temperature of step S210 was set to 120 degrees. Step S210 was performed, but $WF_6$ was provided by sub-dosing/pressurizing 5 times. That is, during the first-dosing/pressurizing, $WF_6$ was provided with the outlet of the chamber closed, thereby increasing the pressure of the chamber to 1.0 Torr. After that, the inlet of the chamber was also closed for 30 seconds, and $WF_6$ was infiltrated at a pressure of 1.0 Torr. After that, the sub-purging was performed for 30 seconds. Thereafter, during the second sub-dosing/pressurizing, $WF_6$ was provided with the outlet of the chamber closed, and the pressure in the chamber was again increased to 1.0 Torr. After that, the inlet of the chamber was also closed for 30 seconds, and $WF_6$ was infiltrated at a pressure of 1.0 Torr. In the same manner, it was performed up to the fifth sub-dosing/pressurizing step, the fifth sub-infiltration step.

Thereafter, the first main purging (process temperature 120 degrees) was performed according to step S220 for 30 seconds.

Thereafter, according to step S230, $Si_2H_6$ was prepared as a reaction gas. The process temperature of step S230 was set to 120 degrees.

Step S230 was performed, but $Si_2H_6$ was provided in 5 sub-dosing/pressurizing and sub-exposure steps. At this time, process variables such as pressure and time were the same as those of $WF_6$ dosing.

Thereafter, a second main purging (process temperature of 120 degrees) was performed for 30 seconds according to step S240.

As a result, a transition metal was deposited on the surface of the S (sulfur)-treated substrate. At this time, step S210 to step S240 were performed once. That is, unlike the first and second embodiments, the cycle was not repeated.

Subsequently, the chalcogen source gas was heated to 100 degrees or more to provide for 30 seconds, followed by purging for 30 seconds. Accordingly, it was possible to deposit a 1 nm thick $WS_2$ monolayer as the active monolayer 146.

Figure 22:
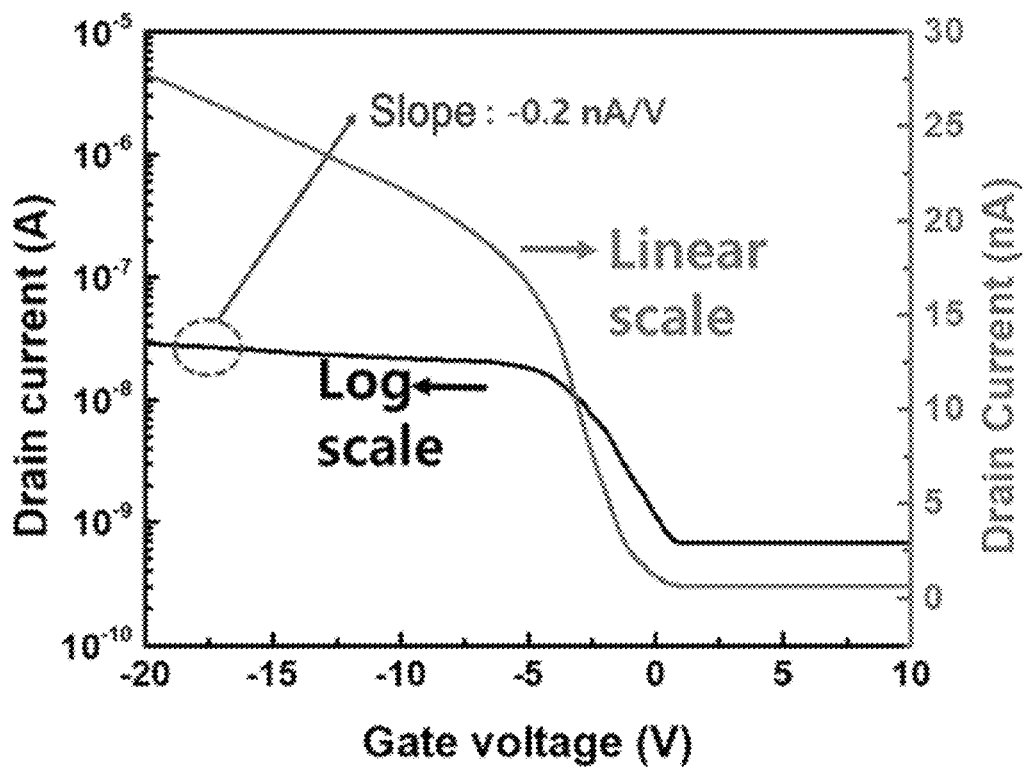

FIGS. 21 and 22 are diagrams for illustrating operating characteristics of a device according to a third embodiment of the present invention.

Referring to FIG. 21, in the device 100c according to the third embodiment of the present invention, first and second barriers 130 and 150 and an active monolayer 146 may form a quantum well structure. In this case, since the active monolayer 146 shows a quantum confinement effect in a short axis direction (e.g., a thickness direction), current flow may be limited.

Referring to FIG. 22, the device manufactured according to the third embodiment of the present invention has a turn-on voltage around 0V. That is, as a voltage of 0V or more is applied to the gate electrode 120, a current flows between the source and drain electrodes 160 and 162. At this time, as the gate voltage applied to the gate electrode 120 increases, the current flowing between the source and drain electrodes 160 and 162 increases. However, when the gate voltage increases to about −5V or more, it can be seen that a region in which an increase in current between the source and drain electrodes 160 and 162 is restricted appears despite an increase in the gate voltage. That is, it can be seen that despite the swing of the gate voltage, the current increase between the source and drain electrodes is extremely limited to −0.2 nA/V. It is interpreted that this is because the active monolayer 142 has an energy level quantized in the short axis direction.

The film structures and devices according to the first to third embodiments of the present invention may have a superlattice structure and a quantum well structure, and may have a quantized energy level in at least one axial direction. Accordingly, it is possible to provide a peculiar effect of current flow saturation as well as current flow limitation even in the range in which the gate voltage greater than or equal to the turn-on voltage.

In addition, in describing the devices for the first to third embodiments, the description was made with reference to the transistor structure, but the film structures according to the first to third embodiments of the present invention can be applied to 3-terminal devices and 2-terminal devices other than transistors.

Since the film structures according to the first to third embodiments of the present invention limit current flow, the film structures according to the embodiments may provide multilevel characteristics. More specifically, when the film structures according to the embodiments are stacked, a non-gating region due to current saturation may occur between the turn-on voltages of each of the film structures. That is, activation of the active monolayers of each of the film structures can be clearly distinguished. Accordingly, the film structure according to the embodiments of the present invention can be used in a multilevel device. Hereinafter, a multilevel device according to embodiments of the present invention will be described.

A multilevel device according to an embodiment of the present invention may have a structure in which a first active layer, a barrier layer, and a second active layer are sequentially stacked. In this case, the number of activated active layers among the first and second active layers may be controlled according to a gate voltage applied to the gate electrode of the multilevel device according to an exemplary embodiment.

Conductive activation of the first and second active layers may be controlled according to the magnitude of the gate voltage applied to the gate electrode. For example, the case where a first gate voltage range, a second gate voltage range that is a region greater than the first gate voltage range, or a third gate voltage range that is a region greater than the second gate voltage range is applied to the gate electrode will be described separately.

For reference, in this specification, the gate voltage is described based on an absolute value without distinguishing between positive and negative. In addition, the first gate voltage range may be understood as R1 in FIGS. 25 and 28, the second gate voltage range as R2 in FIGS. 25 and 28, and the third gate voltage range as R3 in FIGS. 25 and 28.

First, the smallest gate voltage among the first gate voltage range may be the first turn-on voltage. When the first turn-on voltage is applied to the gate electrode, the first active layer may be activated, that is, turned on. In this case, the second active layer may be inactive, that is, in a turn-off state. Thereafter, as the voltage increases within the first gate voltage range, the amount of current flowing between the source and drain electrodes may increase. That is, the ratio of the increase in the current between the source/drain electrodes to the increase in the gate voltage within the first gate voltage range may be represented by the first slope.

For convenience of explanation, application of the gate voltage in the second gate voltage range will be described later, and application of the gate voltage in the third gate voltage range will be described first. When a gate voltage of a third gate voltage range larger than the first and second gate voltage ranges is applied, not only the first active layer but also the second active layer may be activated, that is, turned on. That is, the smallest gate voltage within the third gate voltage range may be the second turn-on voltage. Thereafter, as the gate voltage increases within the third gate voltage range, the amount of current flowing between the source and drain electrodes may increase with a third slope. That is, the ratio of the increase in the current between the source/drain electrodes to the increase in the gate voltage within the third gate voltage range may be represented by the third slope. At this time, when a gate voltage within the third gate voltage range is applied, both the first and second active layers are turned on, so that a larger current may flow between the source and drain electrodes compared to when a gate voltage within the first gate voltage range is applied.

When a gate voltage within a second gate voltage range greater than the first gate voltage range and smaller than the third gate voltage range is applied to the gate electrode, only the first active layer may be activated, that is, in a turn-on state. In this case, even if the gate voltage increases within the second gate voltage range, the degree of current flow between the source/drain electrodes may be maintained. That is, when the gate voltage increases within the first gate voltage range, the amount of current flowing between the source and drain electrodes increases, for example, with a first slope. Meanwhile, when the gate voltage increases within the second gate voltage range, a change in the amount of current flowing between the source and drain electrodes may be smaller than the first and third slopes. More specifically, when the gate voltage increases within the second gate voltage range, a current value between the source and drain electrodes may be constant. In other words, the second slope may be zero. Accordingly, the multilevel device according to an embodiment of the present invention may provide multilevel conductivity.

From a mechanism point of view, when a gate voltage within the first gate voltage range is applied, the first active layer may be turned on. In this case, due to the current flowing through the first active layer (electrons from the source electrode tunnel the second active layer and the barrier layer), the field due to the gate voltage does not reach the second active layer and is shielded (shielding effect).

When a gate voltage in the second gate voltage range is applied, the field due to the gate voltage cannot reach the second active layer and is shielded by the current flowing through the first active layer. In addition, when the gate voltage of the second region is applied, the current between the source and drain electrodes constantly flows even if the gate voltage is increased due to saturation of the first active layer. In another aspect, even if the gate voltage increases within the second gate voltage range, the barrier layer may delay gating of the second active layer and maintain a limited flow of electrons in the first active layer.

When a gate voltage in the third gate voltage range is applied, the gate voltage reaches the second active layer due to field penetration. Accordingly, the second active layer can be turned on.

According to the first embodiment, in order for the gate voltage to reach the second active layer by field penetration, it may be preferable that the first active layer is a TMDC monolayer. If the first active layer is thicker, the amount of current flowing through the first active layer increases. Accordingly, the shielding effect of the first active layer preventing the gate voltage from penetrating the field into the second active layer is increased. In this case, an excessively large gate voltage is required to turn on the second active layer, which is disadvantageous in terms of power consumption. In addition, since the gate insulating layer needs to be thicker in order to withstand a large gate voltage, it does not meet the trend of miniaturization of the transistor. On the other hand, when the first active layer is a TMDC monolayer, the second active layer can be turned on even within a typical gate voltage range, thus meeting the trend of power consumption and miniaturization.

Hereinafter, a multilevel device according to an embodiment of the present invention will be described in detail.

Figure 23:
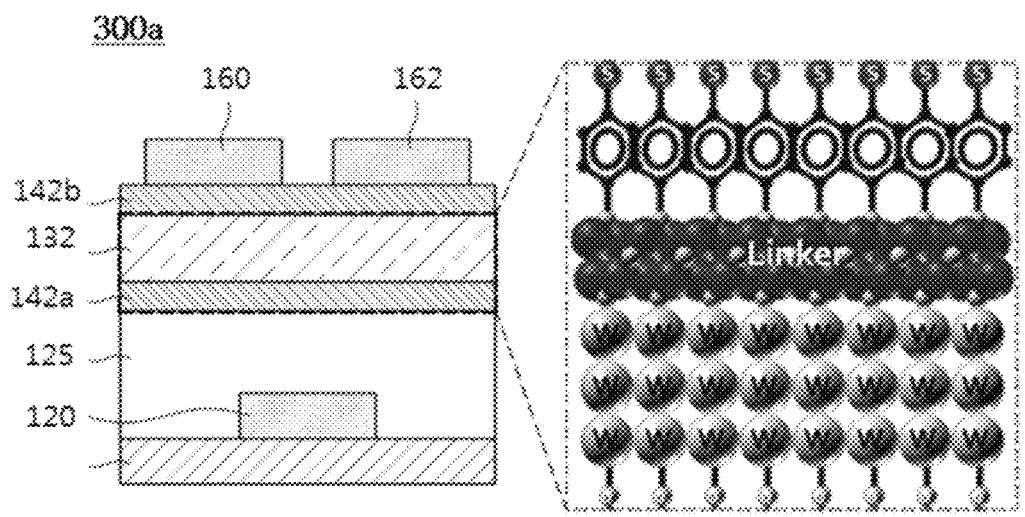
FIG. 23 is a diagram for illustrating a multilevel device according to a first embodiment of the present invention.

FIG. 23 is a diagram for describing a multilevel device according to the first embodiment of the present invention.

Referring to FIG. 23, a multilevel device 300a according to an embodiment of the present invention may include a substrate, a gate electrode 120, a gate insulating layer 125, a first active layer 142a, a barrier layer 132, a second active layer 142b, the source electrode 160, and the drain electrode 162.

As shown on the right side of FIG. 23, the first active layer 142a includes W, which is a metal monoatomic layer, and the second barrier layer 132 includes ZnO, which is a first barrier layer, and 4MP, which is a second barrier layer. In addition, the second active layer 142b may include a metal monoatomic layer of W.

That is, the multilevel device according to the first embodiment of the present invention may be based on the device according to the second embodiment of the present invention.

Figure 24:
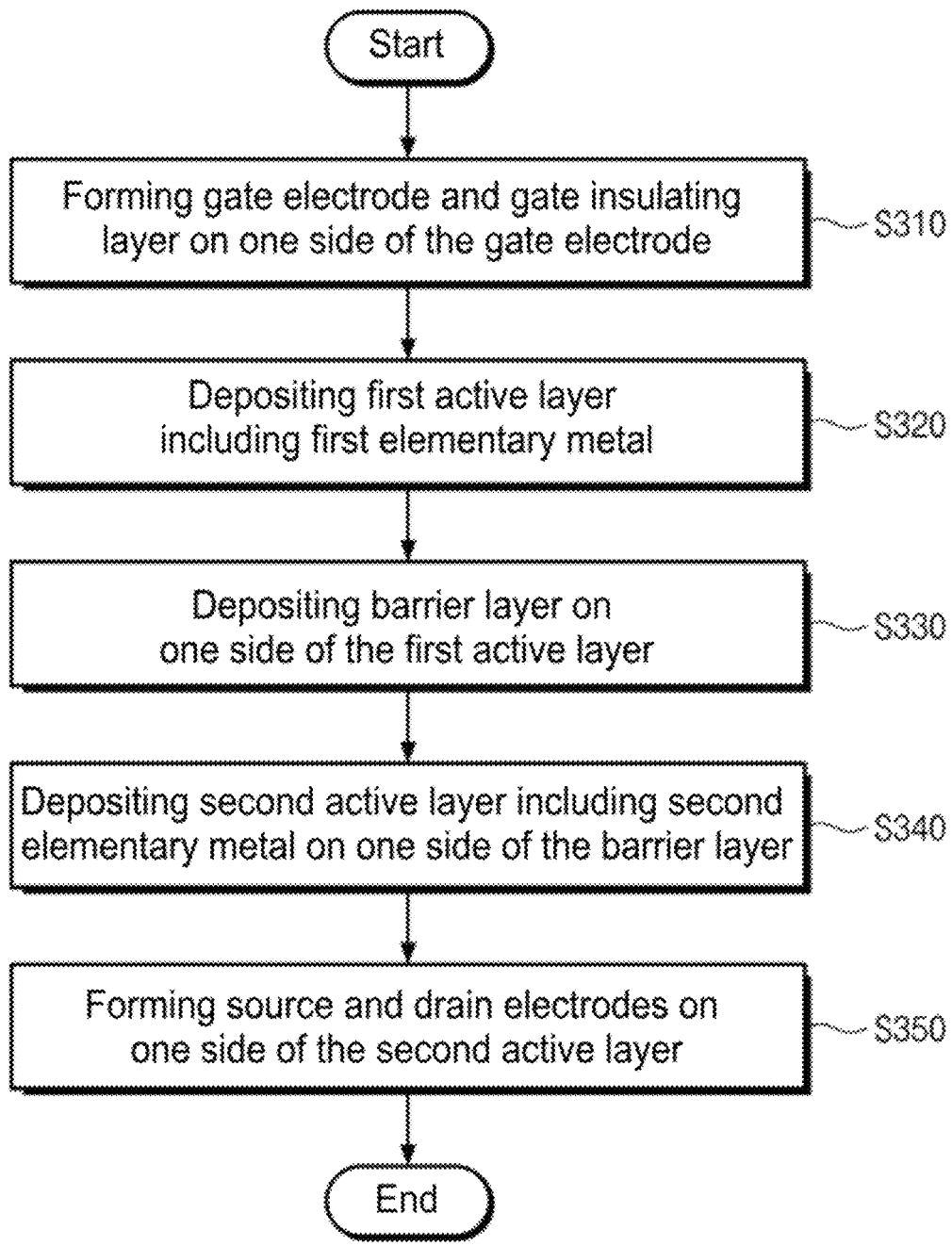
FIG. 24 is a diagram for illustrating a method of manufacturing a multilevel device according to a first embodiment of the present invention.

FIG. 24 is a diagram for illustrating a method of manufacturing a multilevel device according to the first embodiment of the present invention.

Referring to FIG. 24, the method of manufacturing a multilevel device according to the first embodiment of the present invention may include at least one step of forming a gate electrode and a gate insulating layer on one side of the gate electrode (S310), depositing a first active layer including a first elementary metal (S320), depositing a barrier layer on one side of the first active layer (S330), depositing a second active layer including a second elementary metal on one side of the barrier layer (S340), and forming source and drain electrodes on one side of the second active layer (S350). Hereinafter, each step will be described in detail.

Step S310

In step S310, a gate electrode may be formed on a substrate, and a gate insulating layer may be formed on one side of the gate electrode. The gate electrode has a configuration to which a gate voltage is applied, and may be made of any material having conductivity, for example, a metal. The gate insulating layer is configured to prevent leakage of the gate current applied to the gate electrode, and may be made of any material having insulation, for example, at least one of $Al_2O_3$, $SiN_x$, and $SiO_2$.

Step S320

In step S320, a first active layer including a first elementary metal may be deposited on one side of the gate insulating layer. Since step S320 corresponds to the process described with reference to FIG. 15 above, a detailed description will be omitted. It goes without saying that the pressurized dosing step described with reference to FIG. 7 may be applied in step S320 as well.

As a result, the first active layer including the first elementary metal may be manufactured. In this case, the thickness of the first active layer may be, for example, more than 0.7 nm and less than 4 nm, preferably 1 nm or more and 2 nm or less.

Step S330

In step S330, a barrier layer may be deposited on the first active layer. The barrier layer may be provided between the second active layer to be described later and the deposited first active layer.

In step S330, a barrier layer, for example, an organic molecular layer and/or an inorganic molecular layer may be formed through a molecular layer growth method. In this case, step S330 may include a unit cycle consisting of a step of dosing an organic precursor and purging. One organic molecular layer may be formed by one unit cycle. That is, as the unit cycle is repeated, the number of layers of the organic molecular layer to be deposited may be controlled.

In step S330, the pressure range may be 0.001 to 1 Torr, the process temperature range may be 80 to 200 degrees, and in particular, the temperature range of the organic precursor may be 25 to 100 degrees.

Accordingly, the barrier layer having a desired thickness may be deposited on the first active layer.

Step S340 and Step S350

Since step S340 corresponds to step S320, a detailed description will be omitted. Source and drain electrodes may be formed after step S340.

A device having a multilevel conductivity according to the first embodiment of the present invention may be manufactured through steps S310 to S350 described above.

Figure 25:
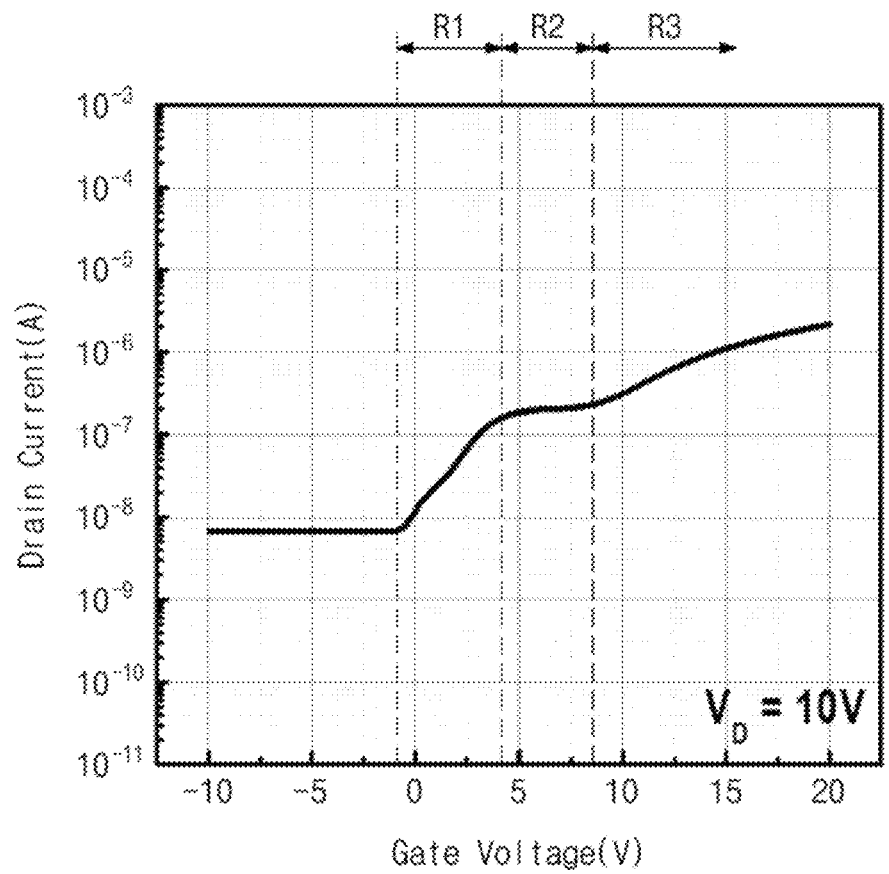
FIG. 25 is a diagram for illustrating characteristics of a multilevel device according to a first embodiment of the present invention.

FIG. 25 is a diagram for describing characteristics of a multilevel device according to the first embodiment of the present invention.

First, for simulation, a multilevel device according to the first embodiment of the present invention was manufactured. At this time, the first active layer and the second active layer were manufactured according to step S320 (process conditions of FIG. 15) described above. Further, the barrier layer formed between the first active layer and the second active layer is composed of a first barrier layer and a second barrier layer. ZnO was formed as the first barrier layer. ZnO was also dosed under pressure. That is, DEZ, which is a ZnO metal precursor source gas, was provided by sub-pressure dosing 5 times. That is, during the first sub-pressure dosing, DEZ was provided with the outlet of the chamber closed, and the pressure of the chamber was increased to 1.0 Torr.

After that, the inlet of the chamber was also closed for 3 seconds to infiltrate DEZ at a pressure of 1.0 Torr. After that, the sub-purging was performed for 30 seconds. Thereafter, during the second sub-pressure dosing, DEZ was provided with the outlet of the chamber closed, and the pressure in the chamber was again increased to 1.0 Torr. After that, the inlet of the chamber was also closed for 3 seconds to infiltrate DEZ at a pressure of 1.0 Torr. In the same manner, up to the fifth sub-pressure dosing steps and up to the fifth sub-penetration step were performed. After this, the first main purging step was performed for 15 seconds. Subsequently, $H_2O$ was provided in five sub-pressurized dosing steps and five sub-exposure steps. At this time, process variables such as pressure and time were the same as those of DEZ dosing. Thereafter, a second main purging step was performed to prepare the first barrier layer.

A second barrier layer was formed on the first barrier layer. 4MP was deposited as the second barrier layer. To this end, 4MP was prepared as an organic precursor, and argon was prepared as a purging gas. The pressure of the step of dosing the organic precursor was 200 mTorr, 20 seconds, and the step of purging continued for 60 seconds. The pressure in each step was set to 100 degrees. Thereby, an organic barrier layer was deposited.

Thus, a multilevel device according to the second embodiment of the present invention was manufactured.

Referring to FIG. 25, when a gate voltage of −1.5 to 4 volts is applied to the gate electrode, it can be seen that the amount of current between the source and drain electrodes increases. That is, −1.5 to 4 volts may be understood as the first gate voltage range R1. This is interpreted as current flow as the first active layer is turned on while the second active layer is turned off as described above.

In addition, when a gate voltage of 4 to 7 volts was applied to the gate electrode, it was confirmed that there was no change in the amount of current between the source and drain electrodes. That is, 4 to 7 volts may be understood as the second gate voltage range R2. It is interpreted that this is because the first active layer is saturated. In addition, it is interpreted that in the gate voltage range of 4 to 7 volts, the gate field reaching the second active layer is shielded by the barrier layer and the first active layer, so that the second active layer cannot be turned on. That is, current saturation may occur due to the quantized energy level in at least one axial direction of the active layer, and the second gate voltage range R2 may be generated by the current saturation.

In addition, when a gate voltage of 7 volts or more is applied to the gate electrode, it can be confirmed that the amount of current between the source and drain electrodes increases again. That is, a gate voltage of 7 volts or more may be understood as the third gate voltage range R3. It is interpreted that at a voltage of 7 volts or more, the gate voltage passes through the first active layer and the barrier layer to reach the second active layer.

Figure 26:
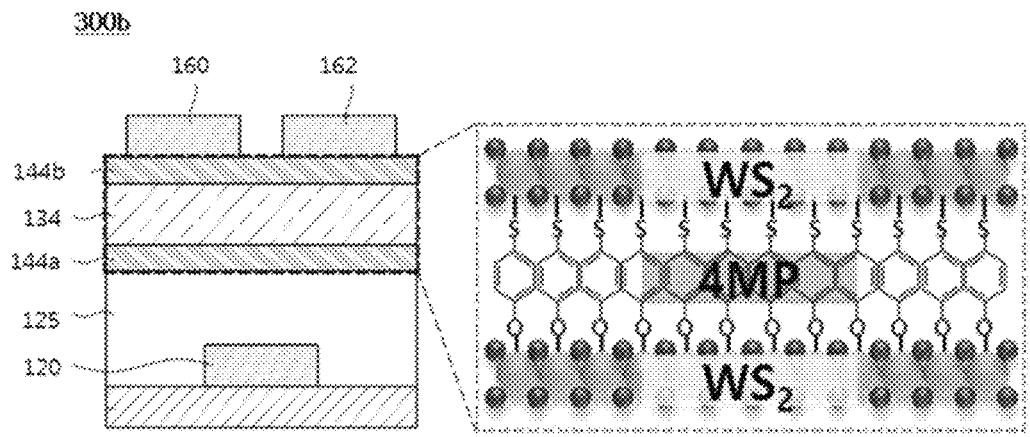
FIG. 26 is a diagram for illustrating a multilevel device according to a second embodiment of the present invention.

FIG. 26 illustrates a multilevel device according to a second embodiment of the present invention.

Referring to FIG. 26, the multilevel device 300b according to the second embodiment of the present invention may include a substrate, a gate electrode 120, a gate insulating layer 125, a first active layer 144a, a barrier layer 134, and a second active layer 144b, a source electrode 160, and a drain electrode 162

As shown, the device according to the second embodiment may have a structure in which the first active layer 144a, the barrier layer 134, and the second active layer 144b are sequentially stacked on the gate electrode 120.

The source and drain electrodes 160 and 162 may electrically contact the second active layer 144b. In other words, the source and drain electrodes 160 and 162 may be electrically non-contact with the first active layer 144a and the barrier layer 134.

As shown in the right figure in FIG. 26, the first active layer 144a may include $WS_2$ TMDC, the second barrier layer 134 includes 4MP, and the second active layer 144b includes $WS_2$ TMDC.

That is, the multilevel device according to the second embodiment of the present invention may be based on the device according to the third embodiment of the present invention.

Figure 27:
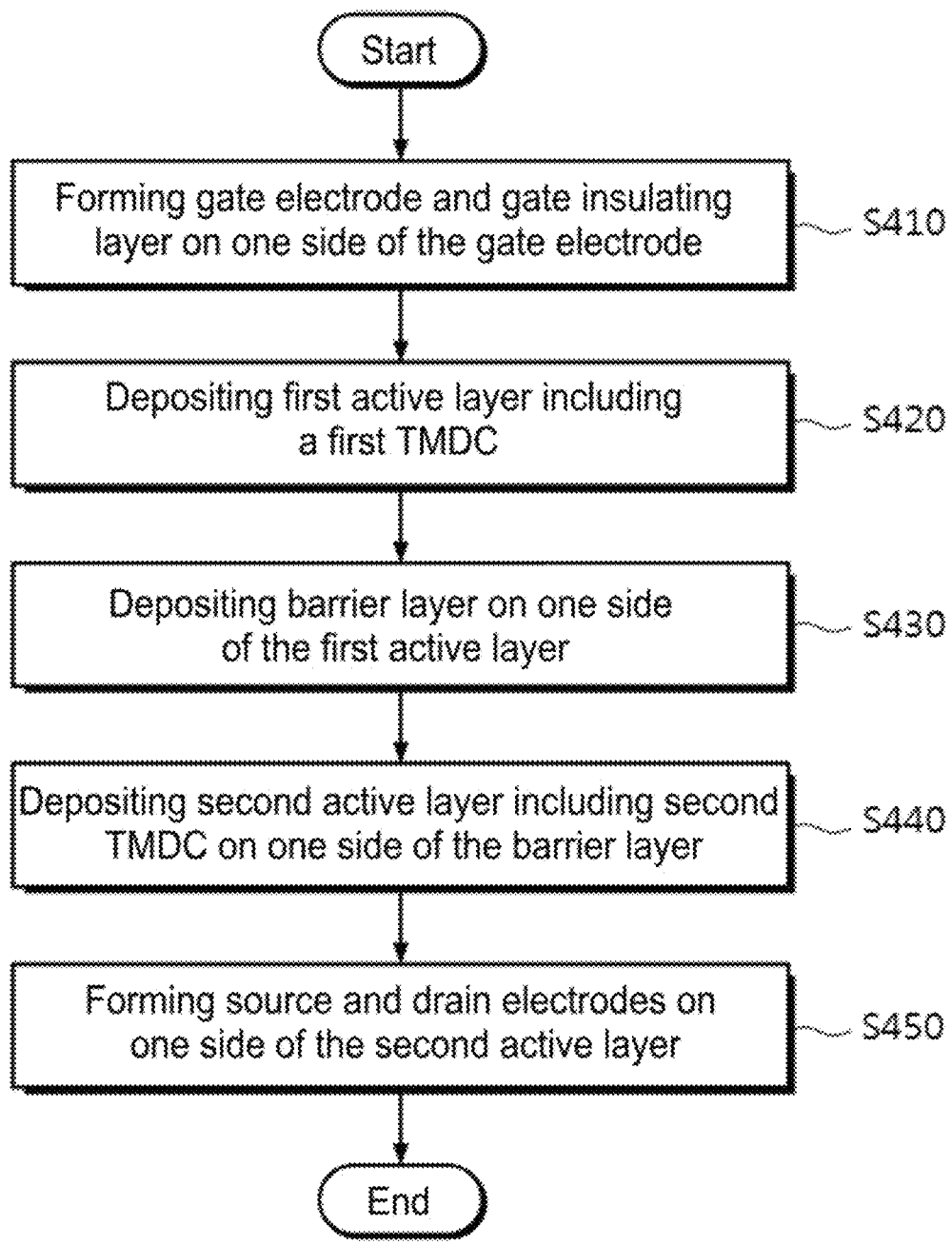
FIG. 27 is a flowchart illustrating a method of manufacturing a multilevel device according to a second embodiment of the present invention.

FIG. 27 is a flowchart illustrating a method of manufacturing a multilevel device according to a second embodiment of the present invention.

Referring to FIG. 27, a method of manufacturing a multilevel device according to a second embodiment of the present invention may include at least one of forming a gate electrode and a gate insulating layer on one side of the gate electrode (S410), depositing a first active layer including a first TMDC (S420), depositing a barrier layer on one side of the first active layer (S430), depositing a second active layer including a second TMDC on one side of the barrier layer (S440), and forming source and drain electrodes on one side of the second active layer (S450).

Steps S410 and S450 correspond to the method of manufacturing a multilevel device according to the first embodiment, and thus detailed descriptions thereof will be omitted. Since steps S420 and S440 correspond to those described with reference to FIG. 20, detailed descriptions will be omitted. Since step S430 corresponds to step S330 described with reference to FIG. 23, a detailed description will be omitted.

Next, multilevel conductivity characteristics according to a second embodiment of the present invention will be described. It was confirmed that the multilevel device manufactured according to the conditions described with reference to FIG. 27 has a multilevel conductivity on the I-V curve, as shown in FIG. 28.

Figure 28:
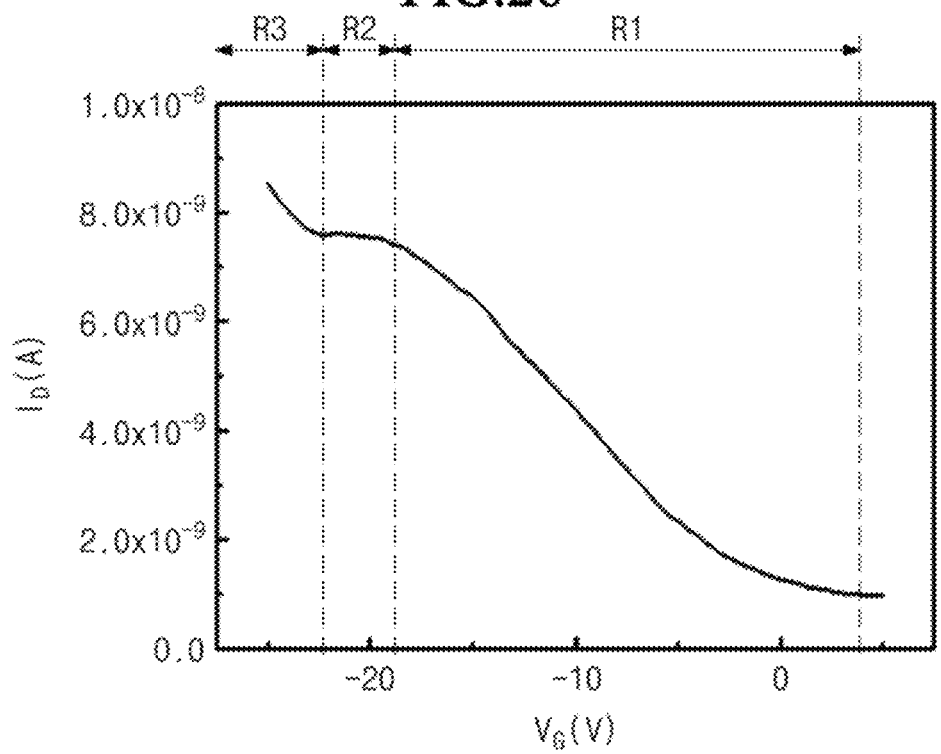
FIG. 28 is a diagram for illustrating characteristics of a multilevel device according to a second embodiment of the present invention.

Referring to FIG. 28, when a gate voltage of 4 to −19 volts is applied to the gate electrode, it can be seen that the amount of current between the source and drain electrodes increases. That is, 4 to −19 volts may be understood as the first gate voltage range R1. This is interpreted as current flow as the first active layer is turned on while the second active layer is turned off as described above.

In addition, when a gate voltage of −19 to −22 volts was applied to the gate electrode, it was confirmed that there was no change in the amount of current between the source and drain electrodes. That is, −19 to −22 volts may be understood as the second gate voltage range R2. It is interpreted that this is because the first active layer is saturated while the second active layer is still turned off in the gate voltage range of −19 to −22 volts. In addition, it is interpreted that in the gate voltage range of −19 to −22 volts, the gate field reaching the second active layer is shielded by the barrier layer and the first active layer, so that the second active layer cannot be turned on. That is, current saturation may occur due to the quantized energy level in at least one axial direction of the active layer, and the second gate voltage range R2 may be generated by the current saturation.

In addition, when a gate voltage of −22 volts or more is applied to the gate electrode, it can be confirmed that the amount of current between the source and drain electrodes increases again. That is, a gate voltage of −22 volts or more may be understood as the third gate voltage range R3. It is interpreted that at a voltage of −22 volts or more, the gate voltage passes through the first active layer and the barrier layer to reach the second active layer.

The multilevel device according to the second embodiment of the present invention has been described above.

Hereinafter, the excellence of the process according to the above-described embodiments of the present invention will be described. First, the excellence of the pressurized dosing step will be described.

Figure 29:
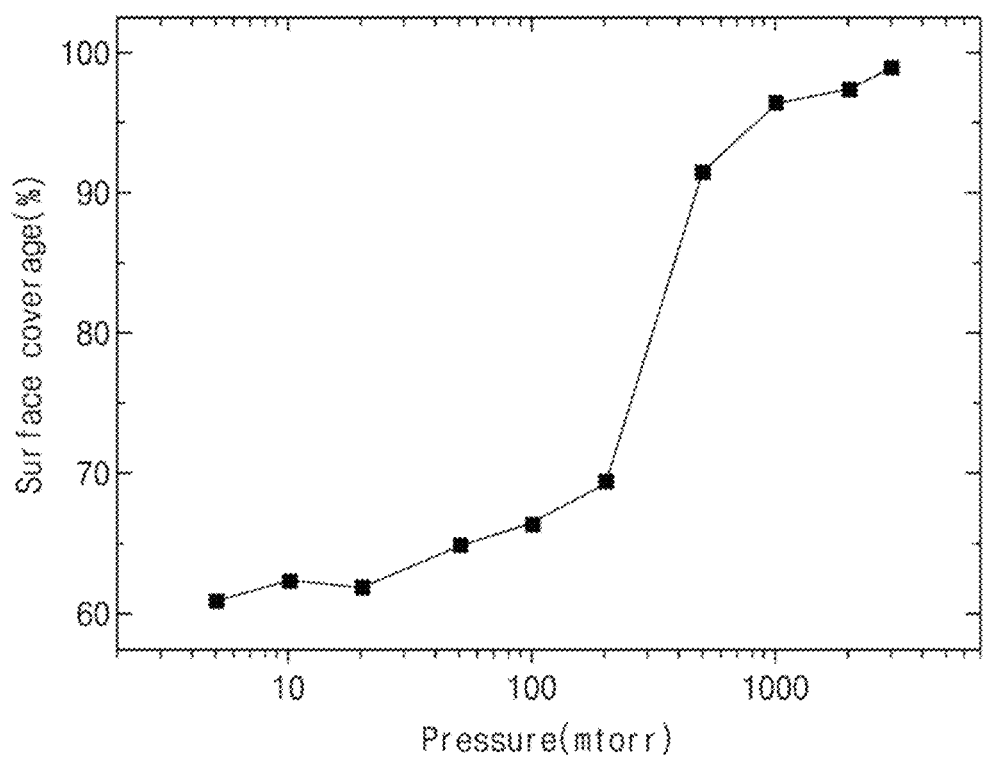
FIG. 29 is a result of measuring the surface coverage according to the pressurized dosing step.

FIG. 29 is a result of measuring the surface coverage while performing the pressurized dosing step described with reference to FIG. 7 using tungsten hexafluoride gas as the source gas, but increasing the chamber pressure by the metal precursor source gas.

Referring to FIG. 29, when the pressure is increased from 5 mTorr to 10 mTorr, 20 mTorr, 50 mTorr, 100 mTorr, 200 mTorr, 300 mTorr, 1000 mTorr, 2000 mTorr, 3000 mTorr, the surface coverage is 61%, 62.5%, 62.65%, 66.5%, 69.5%, 91.5%, 96.5%, 97.5%, 99%, respectively.

That is, when the dosing pressure of the source gas is low (0.2 mTorr), the surface coverage is low (about 70%). However, when the dosing pressure of the source gas was increased to 0.3 Torr or more, it was found that the surface coverage was remarkably excellent at about 90%.

Accordingly, it was confirmed that the minimum pressure of the source gas pressurized dosing step is preferably 0.3 Torr or more.

This means that, as described above, when a source gas is supplied in a state in which the chamber is sealed to form a high pressure in the chamber, the adsorption rate of the source gas on the object surface is significantly increased. Accordingly, excellent film quality may be provided by pressurized dosing according to an embodiment of the present invention.

The pressurized dosing step may be applied to a device according to an embodiment of the present invention and a multilevel device according to an embodiment of the present invention.

Hereinafter, the $WS_2$ characteristics of the device according to the third embodiment and the multilevel device according to the second embodiment will be described.

Figure 30:
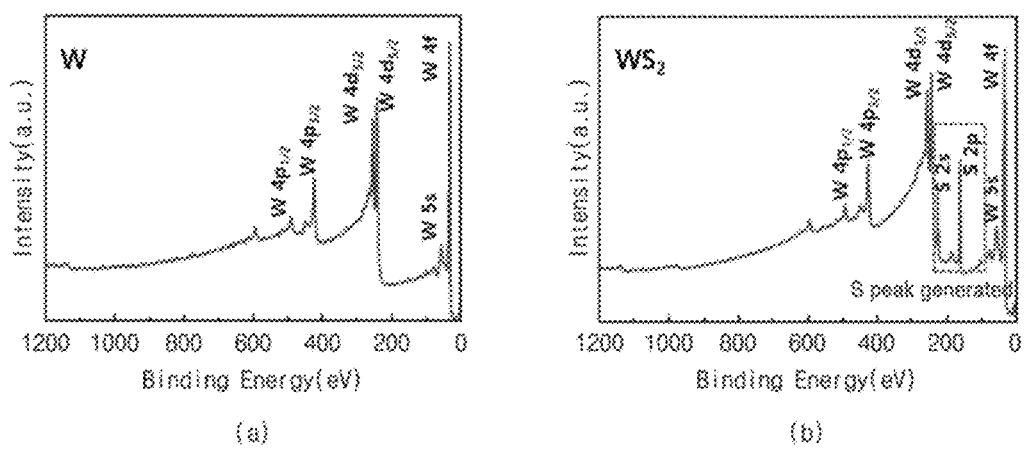
FIGS. 30 to 33 show a $WS_2$ thin film manufactured according to an embodiment of the present invention.
Figure 31:
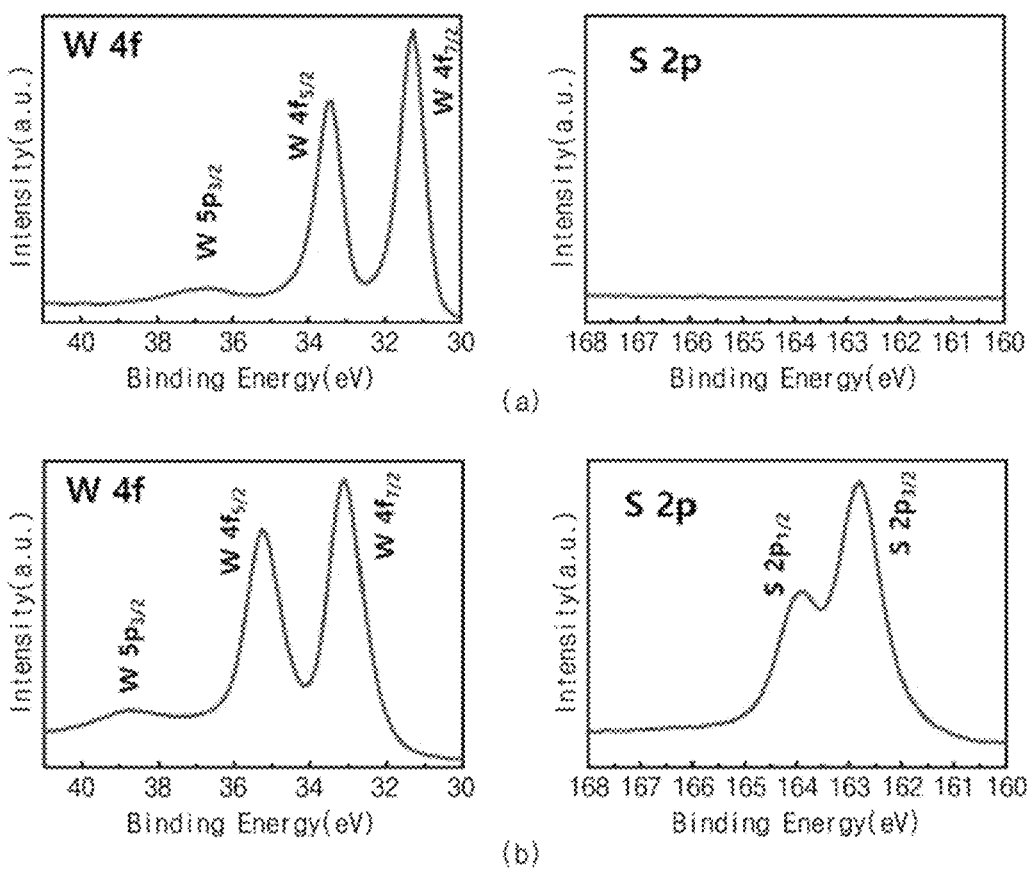

FIGS. 30 and 31, XPS analysis was performed on the $WS_2$ of the device according to the third embodiment of the present invention and of the multilevel device according to the second embodiment. The manufacturing process is the same as described with reference to FIG. 20.

In contrast to the transition metal tungsten XPS peak (FIG. 30(a), FIG. 31(a)), from $WS_2$ prepared according to an embodiment of the present invention, a peak due to S in addition to the peak due to W was clearly identified (FIG. 30(b), FIG. 31(b). Through this, it can be confirmed that $WS_2$ is deposited.

Figure 32:
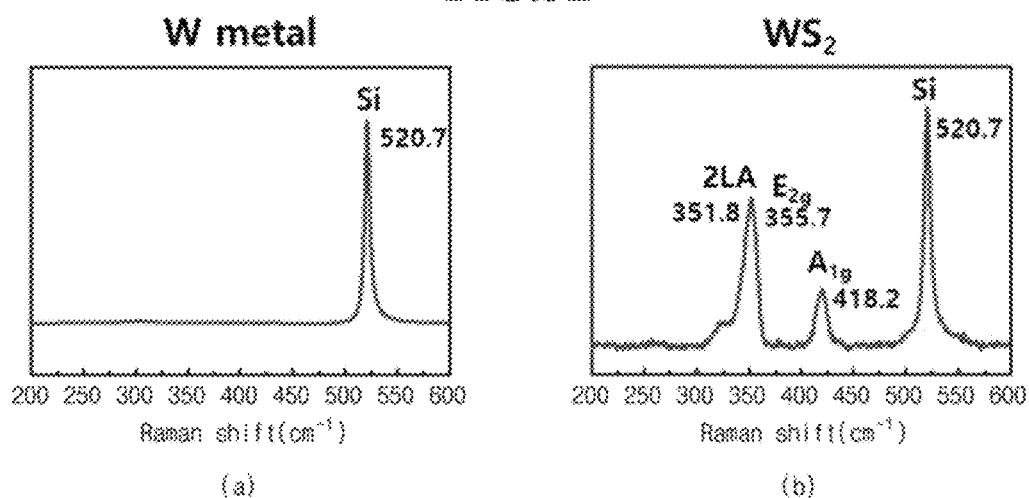

Subsequently, as shown in FIG. 32, raman shift analysis was performed on $WS_2$ manufactured according to an embodiment of the present invention.

As a result of the analysis, it was confirmed that the intensity ratio ($I_{2LA}/IA_{1g}$) was 2.4, and the frequency difference (cm$^{-1}$) between $E_{2g}$ and $A_{1g}$ was 62.5 (FIG. 32(b)). Based on the results of this study, it can be confirmed that the $WS_2$ manufactured according to an embodiment of the present invention is a monolayer.

Figure 33:
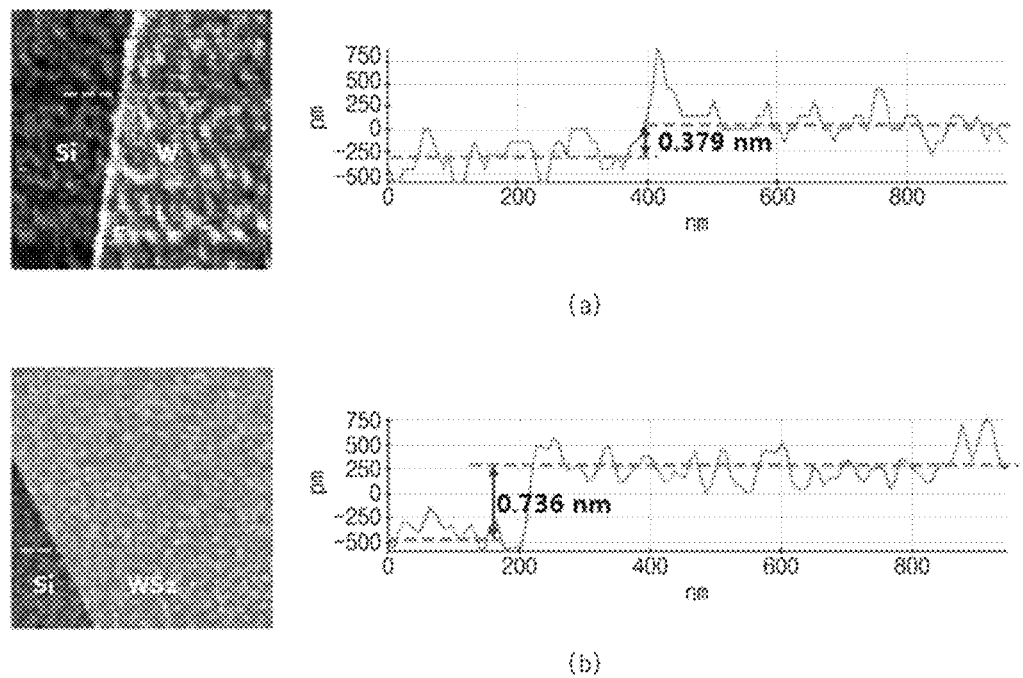

Subsequently, as shown in FIG. 33, AFM analysis was performed on $WS_2$ manufactured according to an embodiment of the present invention.

When tungsten, which is a transition metal, was deposited on a silicon substrate, a thickness deviation of 0.379 nm occurred (FIG. 33(a)), whereas in the case of $WS_2$ manufactured according to an embodiment of the present invention on a silicon substrate, a thickness deviation of 0.736 nm occurred (FIG. 33(b)). According to the thickness deviation of 0.736 nm, it can be seen that the $WS_2$ manufactured according to the embodiment is a monolayer.

Accordingly, it was confirmed that the multilevel device manufactured according to an embodiment of the present invention has a monolayer TMDC active layer having high coverage.

As described above, the present invention has been described in detail using preferred embodiments, but the scope of the present invention is not limited to specific embodiments, and should be interpreted by the appended claims. In addition, those who have acquired ordinary knowledge in this technical field should understand that many modifications and variations are possible without departing from the scope of the present invention.

The invention claimed is:

1. A film structure comprising:
   at least one active monolayer having an energy level quantized in at least one axial direction; and
   at least one layer of a barrier alternately stacked with the at least one layer of the active monolayer,
   wherein a current flows through the active monolayer, and the current flow is limited by the quantized energy level,
   the barrier includes one or more of an organic material and an organic-inorganic composite material, and the barrier includes 4-mercaptophenol,
   the active monolayer includes an amorphous region and a plurality of crystalline regions having island shapes surrounded by the amorphous region, and
   the active monolayer has an energy level quantized in a 3-axis direction.

2. The film structure of claim 1, wherein the active monolayer and the barrier have a hybrid superlattice structure.

3. The film structure of claim 1, wherein the active monolayer has a two-dimensional layered structure.

4. The film structure of claim 1, wherein the stacking of the active monolayer and the barrier provides a quantum well structure.

5. The film structure of claim 1, wherein the active monolayer is made of a metal oxide.

6. The film structure of claim 1, wherein, even if an intensity of a field applied to the active monolayer increases, the current flow may be limited by the quantized energy level.

7. A device comprising:
   a gate electrode;
   a gate insulating layer on one side of the gate electrode;
   at least one active monolayer provided on one side of the gate insulating layer;
   at least one barrier alternately stacked with the at least one active monolayer; and
   a source electrode and a drain electrode, wherein current flows between the source electrode and the drain electrode through the active monolayer when a gate voltage is applied to the gate electrode,
   wherein the barrier includes one or more of an organic material and an organic-inorganic composite material, and the barrier includes 4-mercaptophenol,
   the active monolayer includes an amorphous region and a plurality of crystalline regions having island shapes surrounded by the amorphous region, and
   the active monolayer has an energy level quantized in a 3-axis direction.

8. A device of claim 7, wherein the quantized energy level limits an amount of current flowing through the active monolayer when the gate voltage is equal to or higher than a turn on voltage.

9. A device of claim 7, wherein the active monolayer includes a metal oxide.

10. A device of claim 7, wherein the barrier stacked between the active monolayer and the source and drain electrodes.

11. A device of claim 7, wherein the active monolayer has a structure sandwiched between the barriers.

12. A device of claim 7, wherein the active monolayer has a predetermined thickness, and the predetermined thickness has a nanometer size.

13. A device of claim 7, wherein the active monolayer includes a first active layer and a second active layer, and the first active layer, the barrier, and the second active layer are sequentially stacked, and the number of activated active layers among the first and second active layers is controlled according to the gate voltage applied to the gate electrode.

14. A device of claim 7, wherein the active monolayer includes a first active layer and a second active layer, and the first active layer, the barrier, and the second active layer are sequentially stacked, and the source electrode and the drain electrode are in electrical contact only with the second active layer.

15. A device of claim 7, wherein the voltage applied to the gate electrode is divided into a first gate voltage range, the second gate voltage range, and the third gate voltage range, and the first, the second, and the third gate voltage ranges are provided in an increasing order of the gate voltage.

* * * * *